US007812299B2

United States Patent
Kusaka

(10) Patent No.: US 7,812,299 B2
(45) Date of Patent: Oct. 12, 2010

(54) IMAGE SENSOR HAVING TWO-DIMENSIONALLY ARRAYED PIXELS, FOCUS DETECTING DEVICE USING THE SENSOR, AND IMAGING SYSTEM INCLUDING THE SENSOR

(75) Inventor: Yosuke Kusaka, Yokohama (JP)

(73) Assignee: Nikon Corporation, Tokyo (JP)

( * ) Notice: Subject to any disclaimer, the term of this patent is extended or adjusted under 35 U.S.C. 154(b) by 5 days.

(21) Appl. No.: 11/995,722

(22) PCT Filed: Jul. 21, 2006

(86) PCT No.: PCT/JP2006/314482

§ 371 (c)(1),
(2), (4) Date: Jan. 15, 2008

(87) PCT Pub. No.: WO2007/011026

PCT Pub. Date: Jan. 25, 2007

(65) Prior Publication Data

US 2009/0090841 A1    Apr. 9, 2009

(30) Foreign Application Priority Data

Jul. 22, 2005    (JP)    ............................. 2005-212908

(51) Int. Cl.
*H01L 27/00*    (2006.01)
(52) U.S. Cl. ............. 250/208.1; 250/214.1; 250/214 R; 257/432; 257/443; 348/294; 348/302
(58) Field of Classification Search .............. 250/208.1, 250/208.2, 214.1, 214 R, 201.2–201.8; 257/431, 257/432, 443, 458; 348/302, 294, 291
See application file for complete search history.

(56) References Cited

U.S. PATENT DOCUMENTS

| 4,185,191 | A | | 1/1980 | Stauffer |
| 4,246,476 | A | * | 1/1981 | Stauffer .................... 250/201.2 |
| 4,366,377 | A | * | 12/1982 | Notthoff et al. ............. 257/446 |
| 4,410,804 | A | | 10/1983 | Stauffer |
| 4,882,478 | A | * | 11/1989 | Hayashi et al. .......... 250/214.1 |
| 5,466,962 | A | * | 11/1995 | Yamamoto et al. .......... 257/437 |
| 5,652,925 | A | * | 7/1997 | Aoyagi et al. .................. 396/96 |
| 6,750,437 | B2 | * | 6/2004 | Yamashita et al. ....... 250/208.1 |

(Continued)

FOREIGN PATENT DOCUMENTS

JP    54-159259    12/1979

(Continued)

*Primary Examiner*—Thanh X Luu
*Assistant Examiner*—Francis M Legasse, Jr.
(74) *Attorney, Agent, or Firm*—Ditthavong Mori & Steiner, P.C.

(57) ABSTRACT

Pixels are two-dimensionally arrayed, each of the pixels having a first photoelectric conversion section which is divided into a plurality of regions to perform photoelectric conversions and a second photoelectric conversion section whose outer periphery is surrounded with the plurality of regions of the first photoelectric conversion section and which is divided into a plurality of regions to perform photoelectric conversion. In addition, micro-optical systems are arrayed so as to correspond to the pixels, the micro-optical systems guiding light of an object to the pixels. A division manner of the plurality of regions of the first photoelectric conversion section is different from a division manner of the plurality of regions of the second photoelectric conversion section.

5 Claims, 19 Drawing Sheets

U.S. PATENT DOCUMENTS

| | | |
|---|---|---|
| 6,879,397 B2 * | 4/2005 | Lloyd .......................... 356/336 |
| 2002/0121652 A1 | 9/2002 | Yamasaki |
| 2005/0041949 A1 * | 2/2005 | Onuki et al. ................ 385/140 |

FOREIGN PATENT DOCUMENTS

| JP | 55-143404 | 11/1980 |
|---|---|---|
| JP | 58-24105 | 2/1983 |
| JP | 59-208515 | 11/1984 |
| JP | 2001-250931 | 9/2001 |
| JP | 2002-165126 | 6/2002 |

* cited by examiner

IMAGE SENSOR HAVING TWO-DIMENSIONALLY ARRAYED PIXELS, FOCUS DETECTING DEVICE USING THE SENSOR, AND IMAGING SYSTEM INCLUDING THE SENSOR

TECHNICAL FIELD

The present invention relates to an image sensor, and a focus detecting device and an imaging system using the image sensor.

BACKGROUND ART

A device is known in which a microlens array is formed such that microlenses are arranged in a two-dimensional plane, and a photoelectric conversion element is formed such that two pairs of photoelectric conversion sections are disposed at the rear side of each microlens, so as to detect the focus adjustment state of a photographic optical system in vertical and horizontal directions of an imaging screen by using the image sensor (see Patent Document 1). Also, a configuration is known in which one of the two pairs of photoelectric conversion sections are disposed at the outer side of the other of the two pairs of photoelectric conversion sections (see Patent Document 2).

Patent Document 1: Japanese Unexamined Patent Application Publication No. 58-24105
Patent Document 2: Japanese Unexamined Patent Application Publication No. 55-143404

DISCLOSURE OF THE INVENTION

Problems to be Solved by the Invention

However, with the above-mentioned known devices, vignetting of focus-detecting light beams may occur when the focus detection of the photographic optical system with a large f-number is attempted to be performed, and in particular, the vignetting occurs in an unbalanced manner when the focus detection is performed at a peripheral portion of the imaging screen, resulting in a failure in focus detection.

Means for Solving the Problems

According to a first aspect of the present invention, an image sensor includes two-dimensionally arrayed pixels, each of the pixels having a first photoelectric conversion section which is divided into a plurality of regions to perform photoelectric conversion, and a second photoelectric conversion section whose outer periphery is surrounded with the plurality of regions of the first photoelectric conversion section and which is divided into a plurality of regions to perform photoelectric conversion, and micro-optical systems arrayed so as to correspond to the pixels, the micro-optical systems guiding light of an object to the pixels. A division manner of the plurality of regions of the first photoelectric conversion section is different from a division manner of the plurality of regions of the second photoelectric conversion section.

In the above-described image sensor, an array direction of the plurality of regions of the first photoelectric conversion section may be different from an array direction of the plurality of regions of the second photoelectric conversion section. For example, the array direction of the plurality of regions of the first photoelectric conversion section may be orthogonal to the array direction of the plurality of regions of the second photoelectric conversion section.

The number of divided regions of the first photoelectric conversion section may be larger than the number of divided regions of the second photoelectric conversion section. Also, an area of each of the regions of the first photoelectric conversion section may be equivalent to an area of each of the regions of the second photoelectric conversion section.

In the above-described image sensor, a profile of the second photoelectric conversion section may be circular, and a profile of the first photoelectric conversion section may be rectangular. Alternatively, a profile of the first photoelectric conversion section and a profile of the second photoelectric conversion section may be circular.

According to a second aspect of the present invention, an image sensor includes two-dimensionally arrayed pixels, each of the pixels having a first photoelectric conversion section which is divided into a plurality of regions to perform photoelectric conversion, and a second photoelectric conversion section whose outer periphery is surrounded with the plurality of regions of the first photoelectric conversion section and which is divided into a plurality of regions to perform photoelectric conversion, and micro-optical systems arrayed so as to correspond to the pixels, the micro-optical systems guiding light of an object to the pixels. A profile of the first photoelectric conversion section is rectangular, and a profile of the second photoelectric conversion section is circular.

In the above-described image sensor, a plurality of types of pixels with different division manners may be arranged.

A focus detecting device according to the present invention, with the use of the above-described image sensor, performs correlation calculation by phase detection method based on at least one of outputs from the plurality of regions of the first photoelectric conversion section and outputs from the plurality of regions of the second photoelectric conversion section, to detect a focus adjustment state of a photographic optical system which focuses an object image on the image sensor.

In the above-described focus detecting device, each of the divided regions of the first photoelectric conversion section and each of the divided regions of the second photoelectric conversion section may receive light beams having passed through different regions of an exit pupil of the photographic optical system.

An imaging system according to the present invention, with the use of the above-described image sensor, performs correlation calculation by phase detection method based on at least one of outputs from the plurality of regions of the first photoelectric conversion section and outputs from the plurality of regions of the second photoelectric conversion section, to detect a focus adjustment state of a photographic optical system which focuses an object image on the image sensor, adjusts the focus of the photographic optical system based on a detection result of the focus detecting device, and uses the outputs of the plurality of regions of the first photoelectric conversion section and the outputs of the plurality of regions of the second photoelectric conversion section, to form object image data.

Advantageous Effect of the Invention

With the image sensor of the present invention, the focus detection can be performed in a plurality of directions of the imaging screen while the vignetting of the focus-detecting light beams can be prevented from occurring.

BEST MODE FOR CARRYING OUT THE INVENTION

Figure 1:
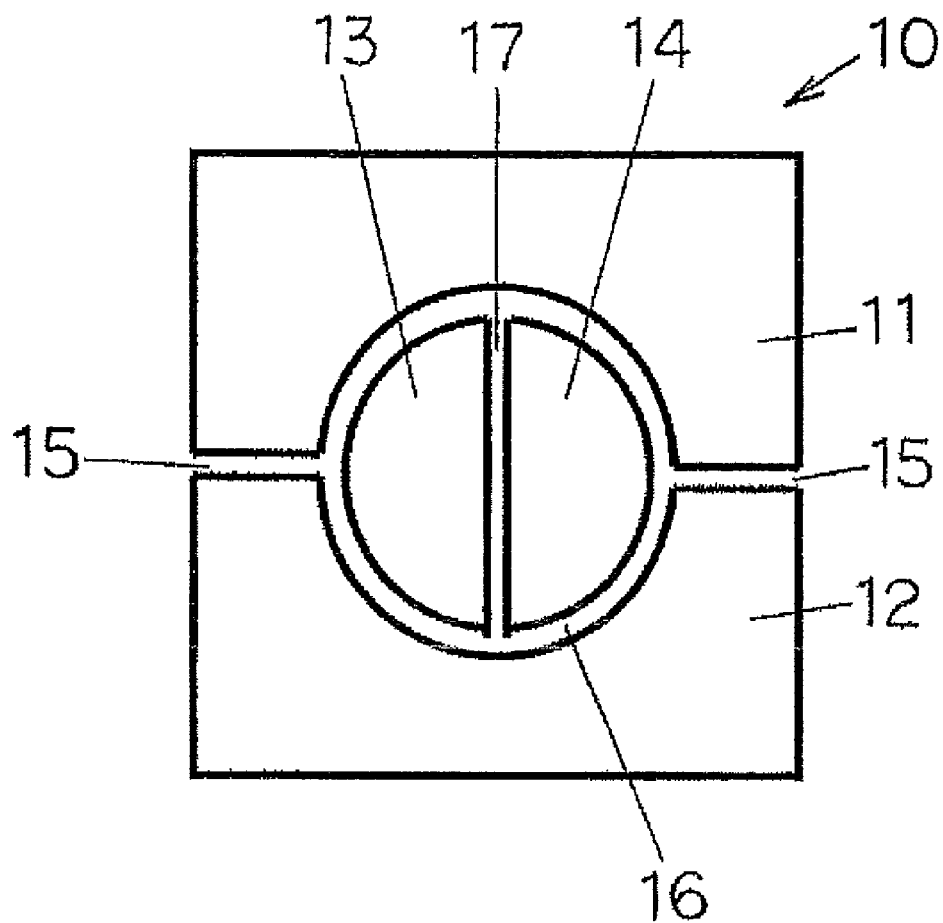
FIG. 1 is an illustration showing an arrangement of photoelectric conversion sections of an image sensor according to an embodiment.

FIG. 1 is an illustration showing an arrangement of photoelectric conversion sections of an image sensor according to an embodiment. The image sensor according to the embodiment has a microlens array in which microlenses are arranged in a two-dimensional plane, and a photoelectric conversion element 10 disposed at the rear side of each microlens. The photoelectric conversion element 10 has two photoelectric conversion sections, i.e., a first photoelectric conversion section (11, 12) and a second photoelectric conversion section (13, 14). The area of the second photoelectric conversion section (13, 14) is smaller than the area of the first photoelectric conversion section (11, 12). The outer periphery of the second photoelectric conversion section (13, 14) is surrounded with the first photoelectric conversion section (11, 12).

The profile of the first photoelectric conversion section (11, 12) is rectangular, and the profile of the second photoelectric conversion section (13, 14) is circular. The first photoelectric conversion section (11, 12) is divided into a pair of photoelectric conversion regions 11 and 12 by separators 15 and 16, and the second photoelectric conversion section (13, 14) is divided into a pair of photoelectric conversion regions 13 and 14 by a separator 17. The separator 15 is orthogonal to the separator 17, and thus, the array direction of the divided regions 11 and 12 of the first photoelectric conversion section is orthogonal to the array direction of the divided regions 13 and 14 of the second photoelectric conversion section.

Figure 2:
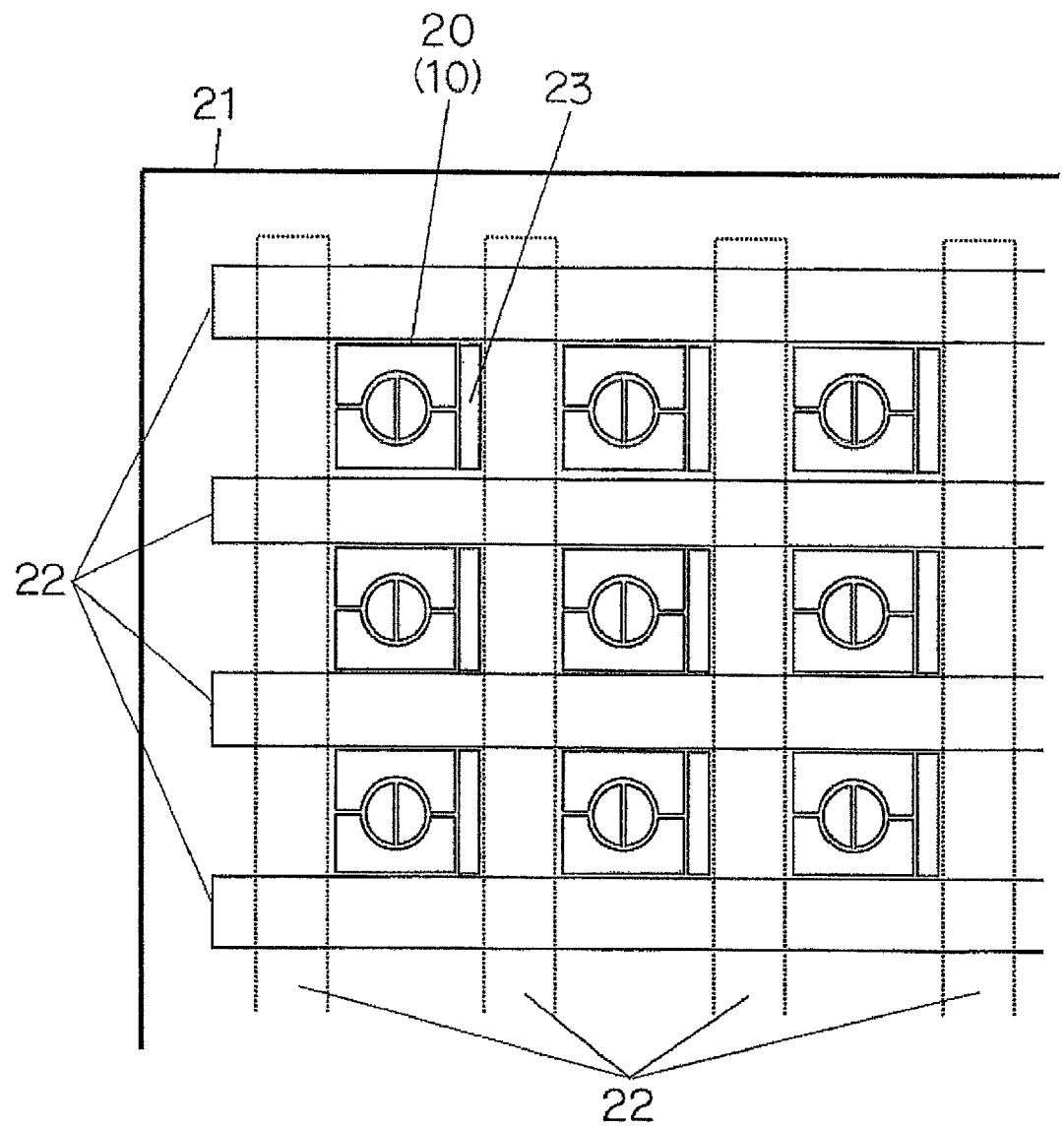
FIG. 2 is an illustration showing a layout of the image sensor on a substrate according to the embodiment.

FIG. 2 is an illustration showing a layout of the image sensor on a substrate according to the embodiment. In the image sensor of the embodiment, a plurality of the photoelectric conversion elements 10 shown in FIG. 1 are two-dimensionally arrayed on a substrate 21, each of the photoelectric conversion elements 10 constituting a pixel 20 of the image sensor. The pixel 20 is provided with a readout circuit 23 for reading out an accumulated charge. In addition, wiring lines 22 for controlling and outputting extend vertically and horizontally on the substrate 21 so that the pixel 20 and the readout circuit 23 are surrounded with the wiring lines 22. A charge accumulated in each pixel 20 is output from the image sensor through the readout circuit 23 and the wiring lines 22.

In the image sensor according to the embodiment, since the profile of the first photoelectric conversion section (11, 12), that is, the profile of the pixel 20 is rectangular, a pair of the pixel 20 and the readout circuit 23 can be surrounded with the wiring lines 22 without a gap, thereby maximizing an area of the pixel 20 (photoelectric conversion element 10), that is, maximizing a light-receiving area Alternatively, the profile of the first photoelectric conversion section (11, 12) may be square.

Pairs of signals output from the first photoelectric conversion sections (11, 12) of the pixels 20 provided on the substrate 21 are used for focus detection in a vertical direction of the substrate 21, i.e., in a vertical direction of an imaging screen. Pairs of signals output from the second photoelectric conversion sections (13, 14) of the pixels 20 provided on the substrate 21 are used for focus detection in a horizontal direction of the substrate 21, i.e., in a horizontal direction of an imaging screen.

Also, desired pixels 20 may be selected by specifying columns and rows from among the plurality of pixels 20 two-dimensionally arrayed on the image sensor substrate 21. Accordingly, using the outputs from the selected pixels 20, the focus detection in the vertical and horizontal directions can be performed at a desired position on the image sensor substrate 21, namely, on the imaging screen.

Figure 3:
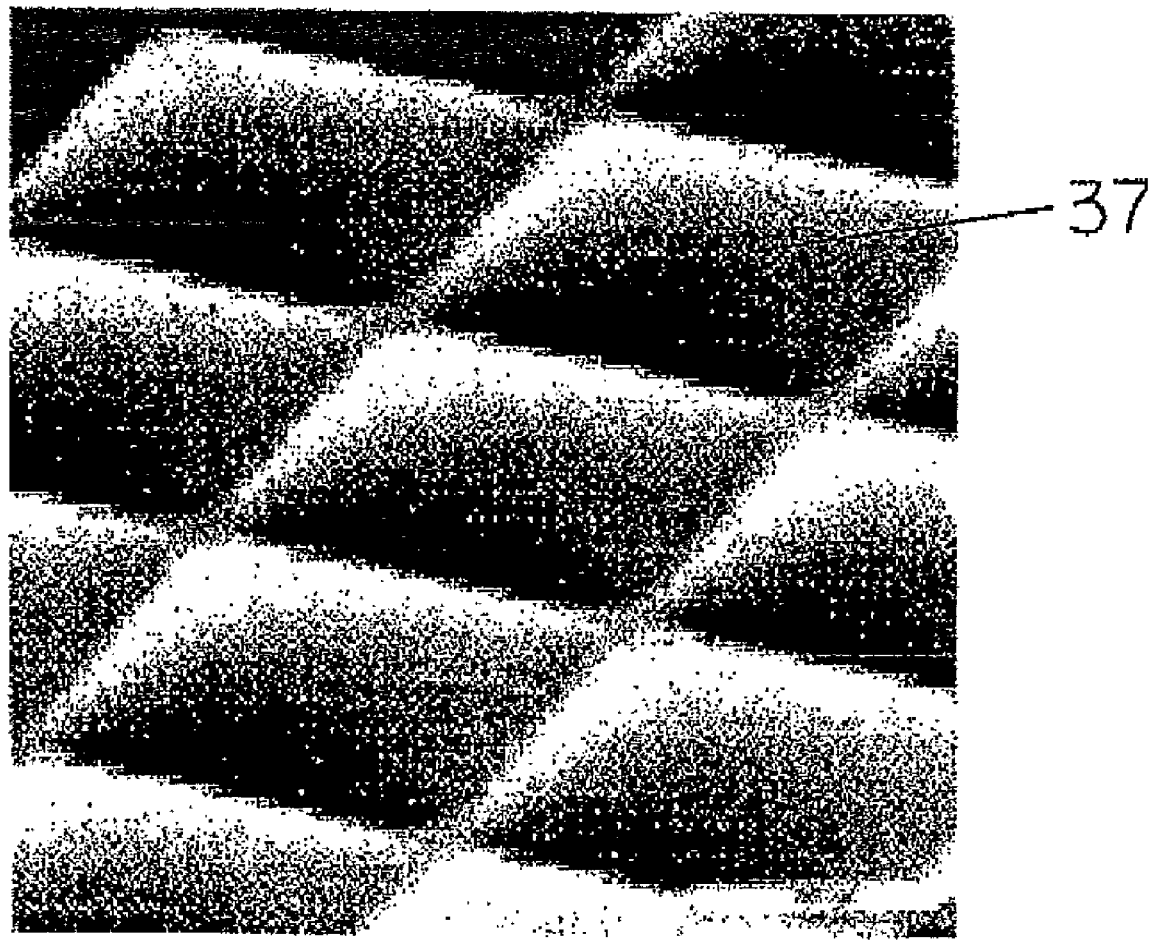
FIG. 3 is a perspective view showing a microlens array disposed at the front side of the image sensor substrate shown in FIG. 2.

FIG. 3 is a perspective view showing a microlens array disposed at the front side of the image sensor substrate 21 shown in FIG. 2. The image sensor according to this embodiment uses a microlens array in which rectangular microlenses 37 are two-dimensionally arrayed. One microlens 37 is provided for every pixel 20. If the microlens 37 is not provided, then light is incident on a portion occupied by the wiring lines 22 between the pixels 20. If the microlens 37 is provided, utilizing a light-condensing function of the microlens 37, light expected to be incident on the wiring lines 22 may enter the pixel 20, thereby increasing the light-receiving amount. So, the boundaries of the microlenses 37 define rectangles, so that all light beams are efficiently incident on the pixels 20. The profile of each microlens 37 is not limited to a rectangle, and may be a polygon, such as a square or a hexagon.

Figure 4:
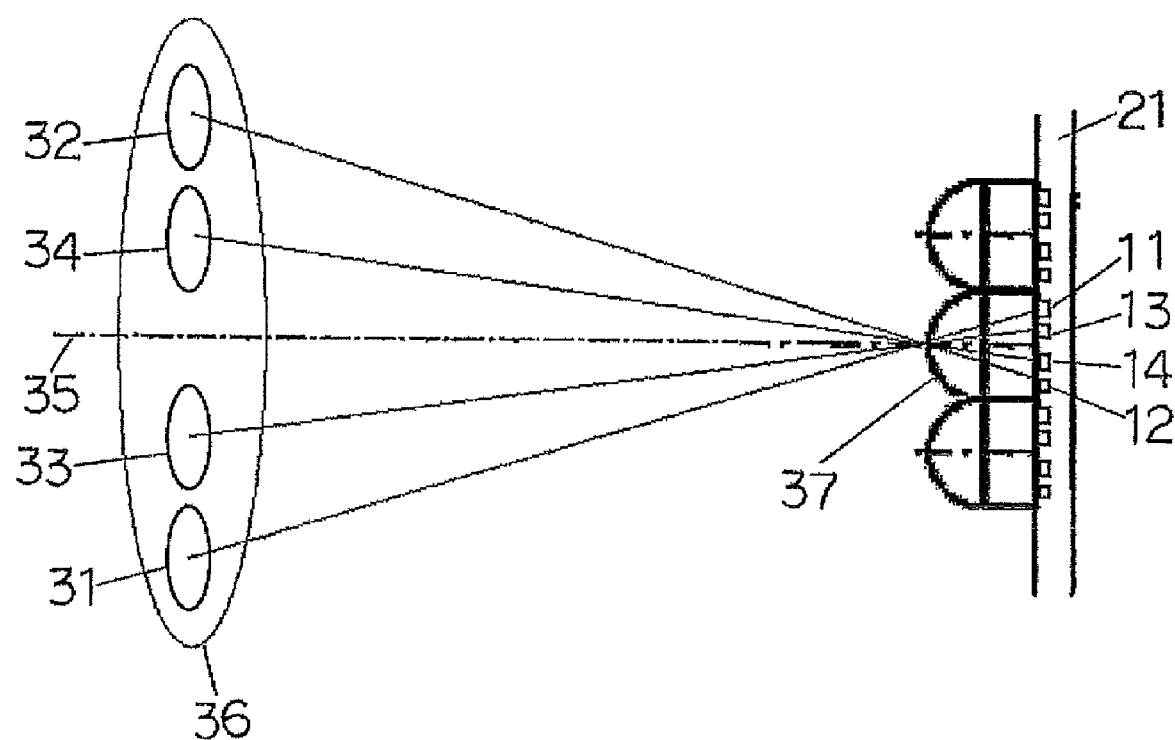
FIG. 4 is an illustration showing a relationship between the image sensor according to the embodiment and an exit pupil of a photographic optical system.

FIG. 4 is an illustration showing a relationship between the image sensor according to the embodiment and an exit pupil of a photographic optical system. Note that the same reference numerals are assigned to elements similar to those shown in FIGS. 1 to 3. To simplify the explanation, in the drawing, the array direction of the divided regions 11 and 12 of the first photoelectric conversion section is aligned with the array direction of the divided regions 13 and 14 of the second photoelectric conversion section. In the drawing, the reference numeral 35 denotes an optical axis of the photographic optical system (not shown), and the reference numeral 36 denotes an exit pupil of the photographic optical system.

The divided region 11 of the first photoelectric conversion section is reversely projected on a region 31 of the exit pupil 36 using the microlens 37. In other words, a light beam passing through the region 31 of the exit pupil 36 is incident on the divided region 11 of the first photoelectric conversion section. In a similar manner, the divided region 12 of the first photoelectric conversion section is projected on a region 32 of the exit pupil 36 using the microlens 37, while a light beam passing through the region 32 of the exit pupil 36 is incident on the divided region 12 of the first photoelectric conversion section.

Also, the divided region 13 of the second photoelectric conversion section is projected on a region 33 of the exit pupil 36 using the microlens 37, while a light beam passing through the region 33 of the exit pupil 36 is incident on the divided region 13 of the second photoelectric conversion section. Further, the divided region 14 of the second photoelectric conversion section is projected on a region 34 of the exit pupil 36 using the microlens 37, while a light beam passing through the region 34 of the exit pupil 36 is incident on the divided region 14 of the second photoelectric conversion section.

The regions 31 and 32 of the exit pupil 36 corresponding to the divided regions 11 and 12 of the first photoelectric conversion section are located at the outer sides of the regions 33 and 34 of the exit pupil 36 corresponding to the divided regions 13 and 14 of the second photoelectric conversion section. Due to this, when the exit pupil of the photographic optical system is small, vignetting of the light beams passing through the regions 31 and 32 located at the outer sides may occur.

Figure 5:
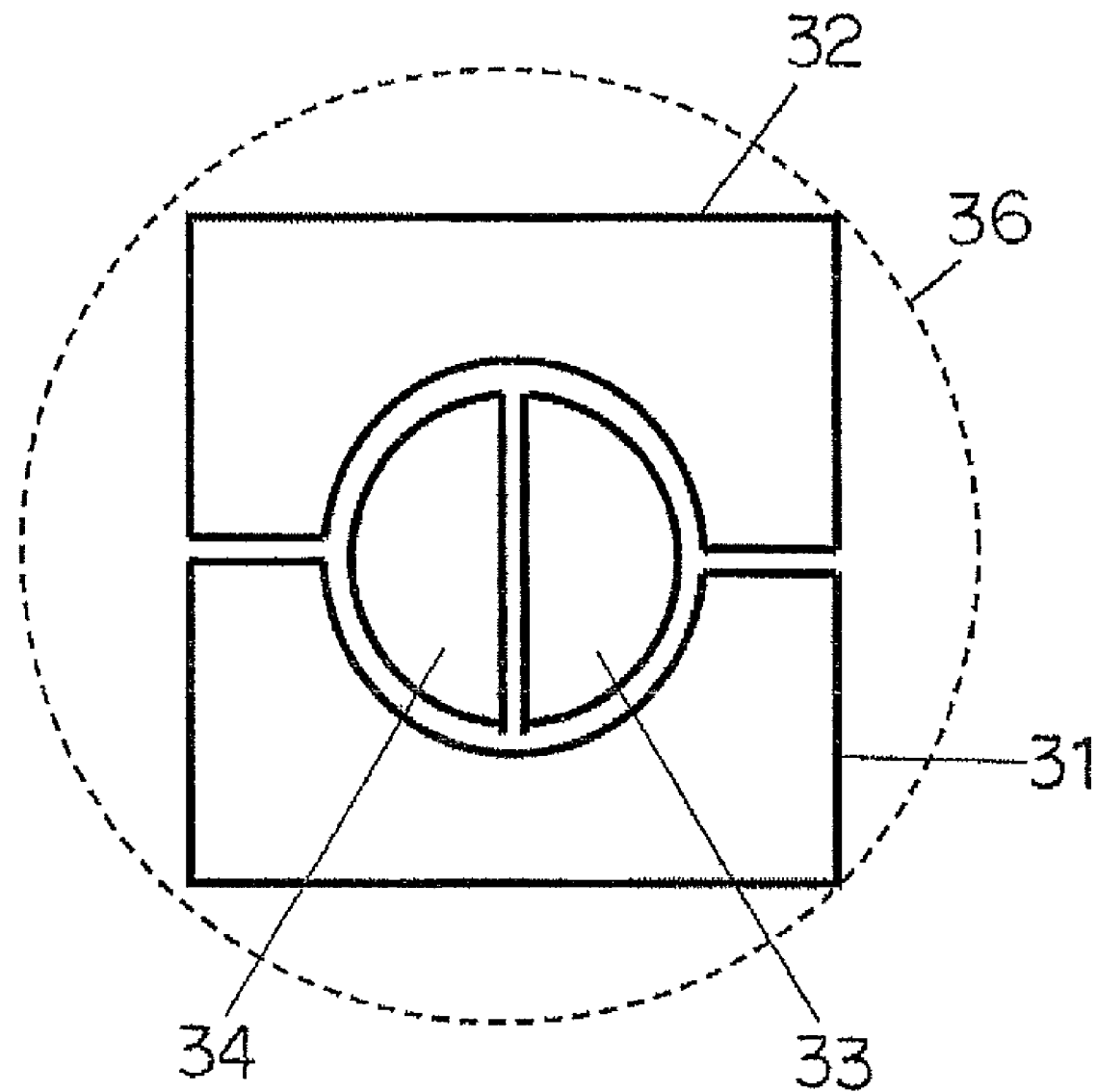
FIG. 5 is an illustration showing a region of the exit pupil corresponding to the divided regions of the photoelectric conversion sections when the exit pupil of the photographic optical system is sufficiently large.

FIG. 5 is an illustration showing a region of the exit pupil corresponding to the divided regions of the photoelectric conversion sections when the exit pupil of the photographic optical system is sufficiently large. When the exit pupil of the photographic optical system is sufficiently large, vignetting of the light beams incident on the regions 31 to 34 corresponding to the divided regions 11 to 14 of the photoelectric conversion sections does not occur. Thus, using signals from the divided regions 11 and 12 of the first photoelectric conversion section and signals from the divided regions 13 and 14 of the second photoelectric conversion section, the focus detection can be performed in the vertical and horizontal directions of the imaging screen.

Figure 6:
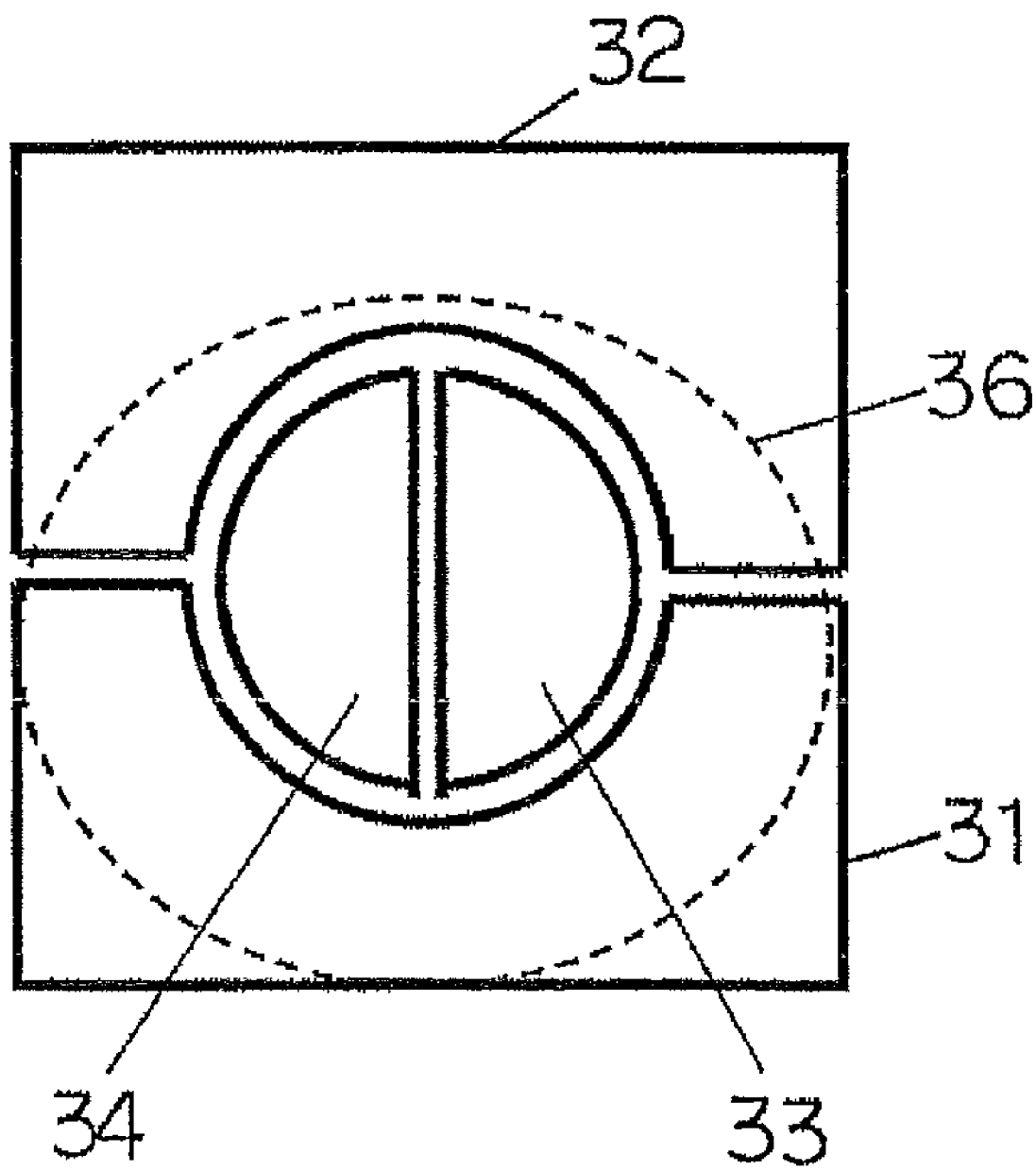
FIG. 6 is an illustration showing a region of the exit pupil corresponding to the divided regions of the photoelectric conversion sections when the exit pupil of the photographic optical system is small.

FIG. 6 is an illustration showing a region of the exit pupil corresponding to the divided regions of the photoelectric conversion sections when the exit pupil of the photographic optical system is small. When the focus-detecting position is located apart from the optical axis of the photographic optical system and located in a peripheral portion of the imaging screen, the profile of the exit pupil 36 is deformed when viewed from the focus-detecting position, and the center of the exit pupil 36 is displaced because of the profiles of lenses other than an aperture of the photographic optical system. If the deformation and displacement occur at the exit pupil 36, vignetting of the light beams passing through the regions 31 and 32 may be caused in an unbalanced manner. In such a case, the light beams passing through the regions 33 and 34, which are not shaded, are used for the focus detection by using the outputs from the divided regions 13 and 14 of the second photoelectric conversion section.

In the image sensor of the embodiment, since the profile of the first photoelectric conversion section (11, 12) is rectangular, the wiring lines 22 for controlling and outputting can be arranged straight such that each of the pixels 20 is surrounded with the wiring lines 22 when the pixels 20 are two-dimensionally arrayed vertically and horizontally.

Also, the light-receiving area of the pixel 20, i.e., the light-receiving area of the photoelectric conversion element 10 can be maximized while realizing an efficient positional relationship with respect to the wiring lines 22.

In addition, in the image sensor of the embodiment, since the second photoelectric conversion section (13, 14) is disposed at the inner side of the first photoelectric conversion section (11, 12), and the profile of the second photoelectric conversion section (13, 14) is circular, vignetting of the focus-detecting light beams does not occur even when the focus detection of the photographic optical system with a large f-number is attempted to be performed, and also, the focus-detecting light beams passing through the exit pupil can be effectively used.

Further, in the image sensor of the embodiment, since the photoelectric conversion sections are divided such that the array direction of the divided regions 11 and 12 of the first photoelectric conversion section is orthogonal to the array direction of the divided regions 13 and 14 of the second photoelectric conversion section, the focus detection of the photographic optical system can be performed in the vertical and horizontal directions of the imaging screen.

Figure 7:
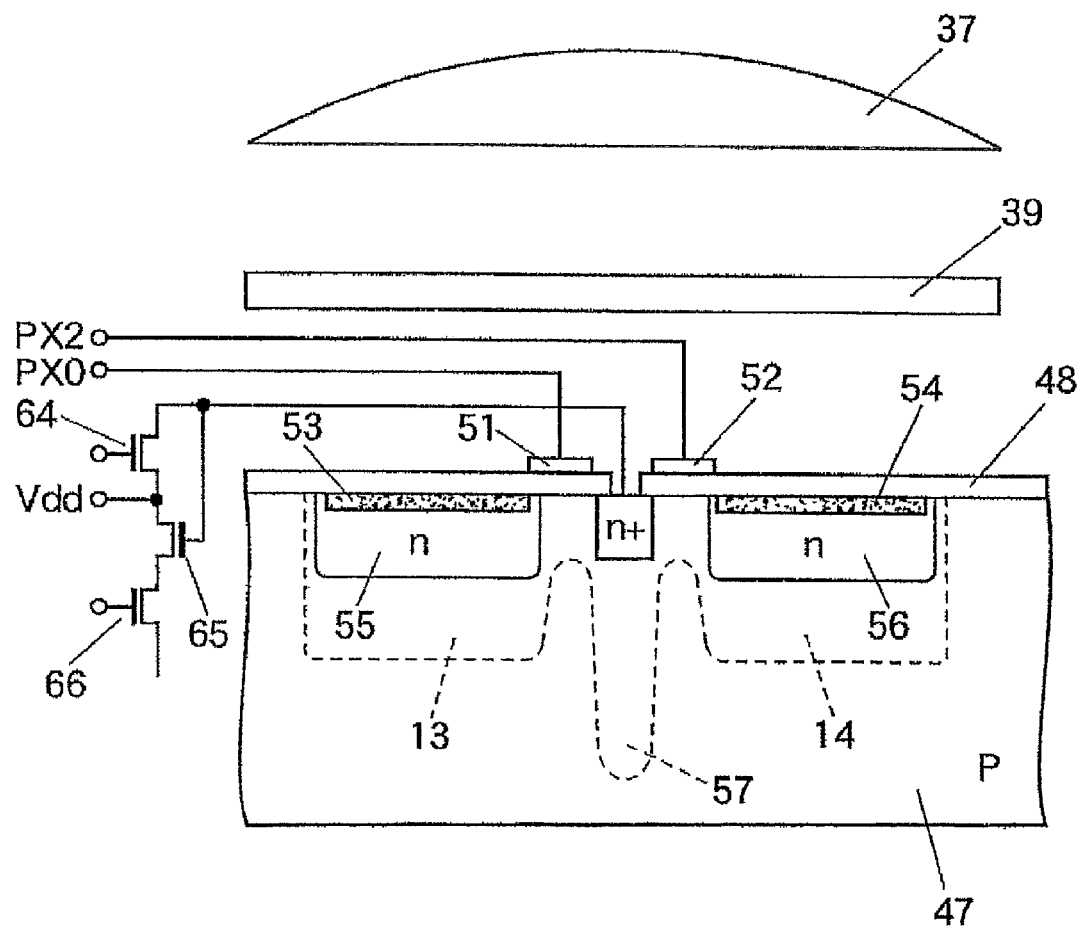
FIG. 7 is a cross-sectional view showing the image sensor substrate for one pixel.

FIG. 7 is a cross-sectional view showing the image sensor substrate for one pixel. To simplify the explanation, only the cross section of the divided regions 13 and 14 of the second photoelectric conversion section is illustrated, and the illustration of the cross section of the divided regions 11 and 12 of the first photoelectric conversion section is omitted. In the drawing, the reference numeral 47 denotes a P-type well, and the reference numeral 48 denotes a $Sio_2$ film as a MOS gate insulating film. Surface P+ layers 53 and 54, and n layers 55 and 56 constitute the divided regions 13 and 14 of the second photoelectric conversion section. Transfer switch MOS transistors 51 and 52 transfer charges accumulated in the divided regions 13 and 14 of the second photoelectric conversion section to a floating diffusion (FD) unit 57.

An optical filter 39 is provided between the microlens 37 and the pixel 20 on the image sensor substrate 21. The shapes and locations of the optical filter 39 and microlens 37 are determined so that the exit pupil of the photographic optical system is conjugate with the divided regions 13 and 14 of the second photoelectric conversion section.

A reset MOS transistor 64 serves as a switch for resetting the ED unit 57 to a predetermined electric potential Vdd. Also, a source follower amplifier MOS transistor 65 serves as an amplifier for amplifying the charges transferred by the transfer switch MOS transistors 51 and 52. Further, a horizontal selection switch MOS transistor 66 serves as a switch for selecting pixels as the readout subject from among the pixels arrayed in the horizontal direction of the image sensor substrate 21, and reading out signals of the selected pixels which are amplified by the source follower amplifier MOS transistor 65.

The FD unit 57 is interposed between the divided regions 13 and 14 of the second photoelectric conversion section. The charges generated at the divided regions 13 and 14 are transferred through the transfer switch MOS transistors 51 and 52, the source follower amplifier MOS transistor 65, and the horizontal selection switch MOS transistor 66.

Figure 8:
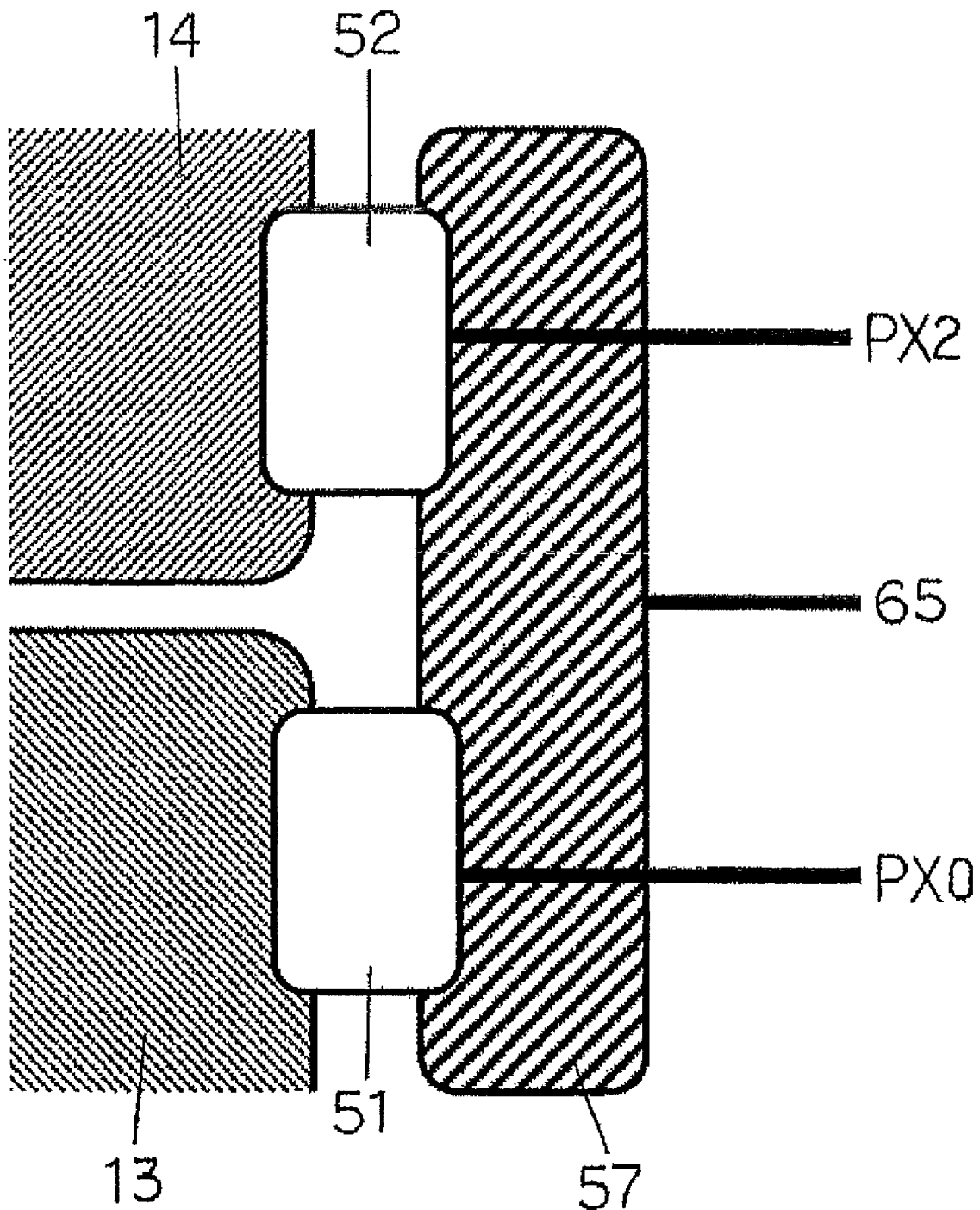
FIG. 8 is an illustration showing an arrangement in the vicinity of transfer switch MOS transistors as viewed from the microlens side.

FIG. 8 is an illustration showing an arrangement in the vicinity of the transfer switch MOS transistors 51 and 52 as viewed from the microlens side. When the transfer switch MOS transistor 51 is turned ON, the charge accumulated in the divided region 13 is transferred to the FD unit 57. When the transfer switch MOS transistor 52 is turned ON, the charge accumulated in the divided region 14 is transferred to the FD unit 57. Control lines to the transfer switch MOS transistors 51 and 52, and output lines from the FD unit 57 are arranged between the separators 15 and 16 shown in FIG. 1.

Alternatively, these wiring lines may employ transparent electrodes (ITO), and may be arranged on the divided regions 11 and 12 of the first photoelectric conversion section. Accordingly, the degree of freedom for the arrangement of the wiring lines can be enhanced without shading the light beams incident on the divided regions 11 and 12 of the first photoelectric conversion section.

Figure 9:
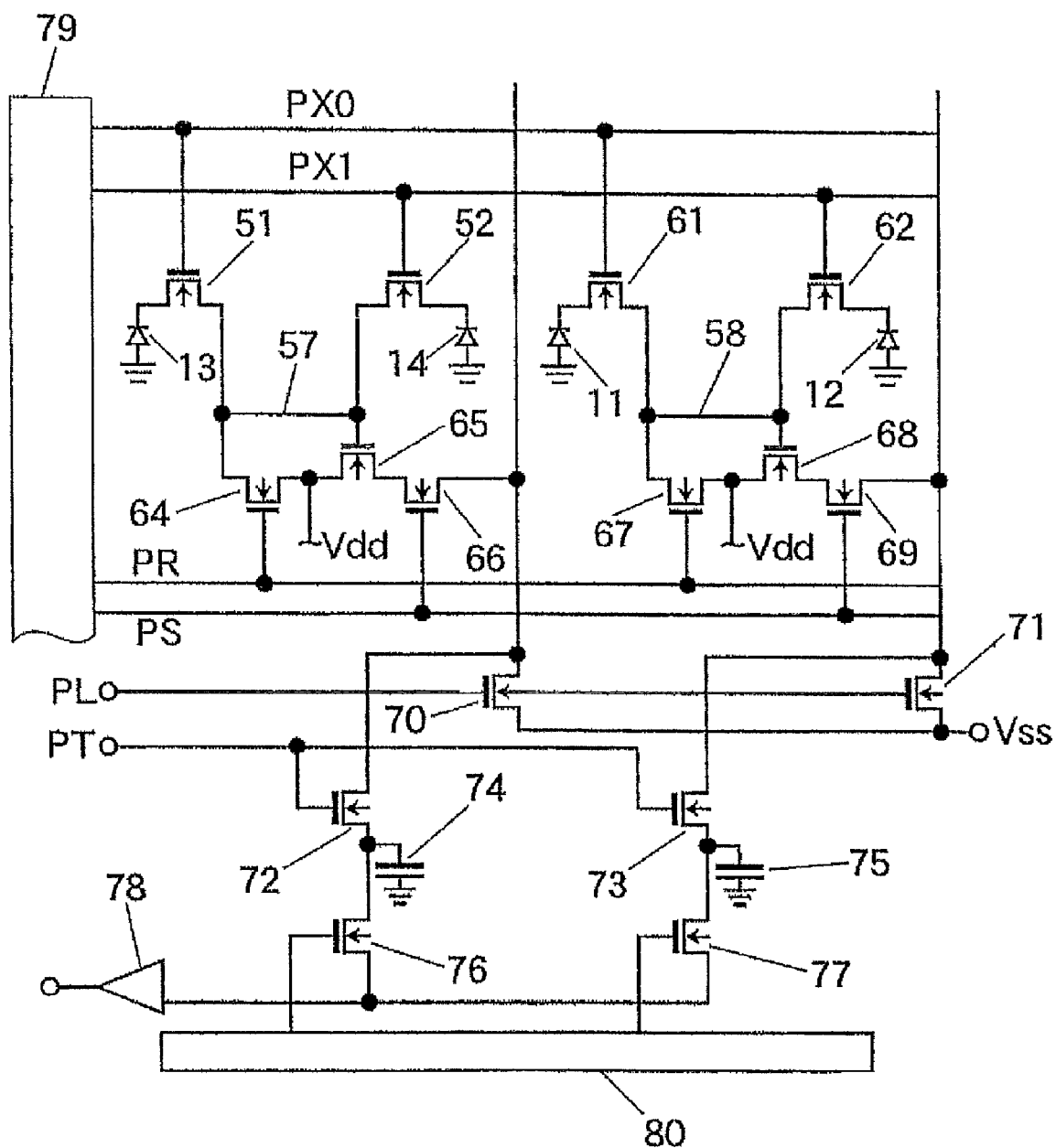
FIG. 9 is a circuit diagram of the image sensor for one pixel according to the embodiment.

FIG. 9 is a circuit diagram of the image sensor for one pixel according to the embodiment. The divided regions 11 and 12 of the first photoelectric conversion section and the divided regions 13 and 14 of the second photoelectric conversion section are made of photodiodes. The reference numerals 51 and 52 denote the above-mentioned transfer switch MOS transistors of the first photoelectric conversion section, and the reference numerals 61 and 62 denotes transfer switch MOS transistors of the second photoelectric conversion section. The reference numeral 64 denotes the above-mentioned reset MOS transistor of the first photoelectric conversion section, and the reference numeral 67 denotes a reset MOS transistor for resetting an FD unit 58 of the second photoelectric conversion section to a predetermined electric potential Vdd.

The reference numeral 65 denotes the above-mentioned source follower amplifier MOS transistor of the first photoelectric conversion section, and the reference numeral 68 denotes a source follower amplifier MOS transistor for amplifying the charges transferred from the transfer switch MOS transistors 61 and 62 of the second photoelectric conversion section. The reference numeral 66 denotes the above-mentioned horizontal selection switch MOS transistor of the first photoelectric conversion section. The reference numeral 69 denotes a horizontal selection switch MOS transistor for selecting pixels as the readout subject from among the pixels arrayed in the horizontal direction of the image sensor substrate 21, and reading out signals of the selected pixels which are amplified by the source follower amplifier MOS transistor 68.

The reference numerals 70 and 71 denote load MOS transistors which constitute source followers together with the source follower MOS transistors 65 and 68. The reference numerals 72 and 73 denote output transfer MOS transistors for transferring the outputs of the pixels. The reference numerals 74 and 75 denote output accumulation capacitors for accumulating the outputs transferred by the output transfer MOS transistors 72 and 73. The reference numerals 76 and 77 denote horizontal transfer MOS transistors for transferring the outputs accumulated in the output accumulation capacitors 74 and 75. The reference numeral 78 denotes a differential output amplifier for amplifying and outputting the signals. The reference numeral 80 denotes a horizontal scanning circuit for controlling ON/OFF of the horizontal transfer MOS transistors 76 and 77. The reference numeral 79 denotes a vertical scanning circuit for controlling ON/OFF of the transfer switch MOS transistors 51, 52, 61, and 62, and the like.

Figure 10:
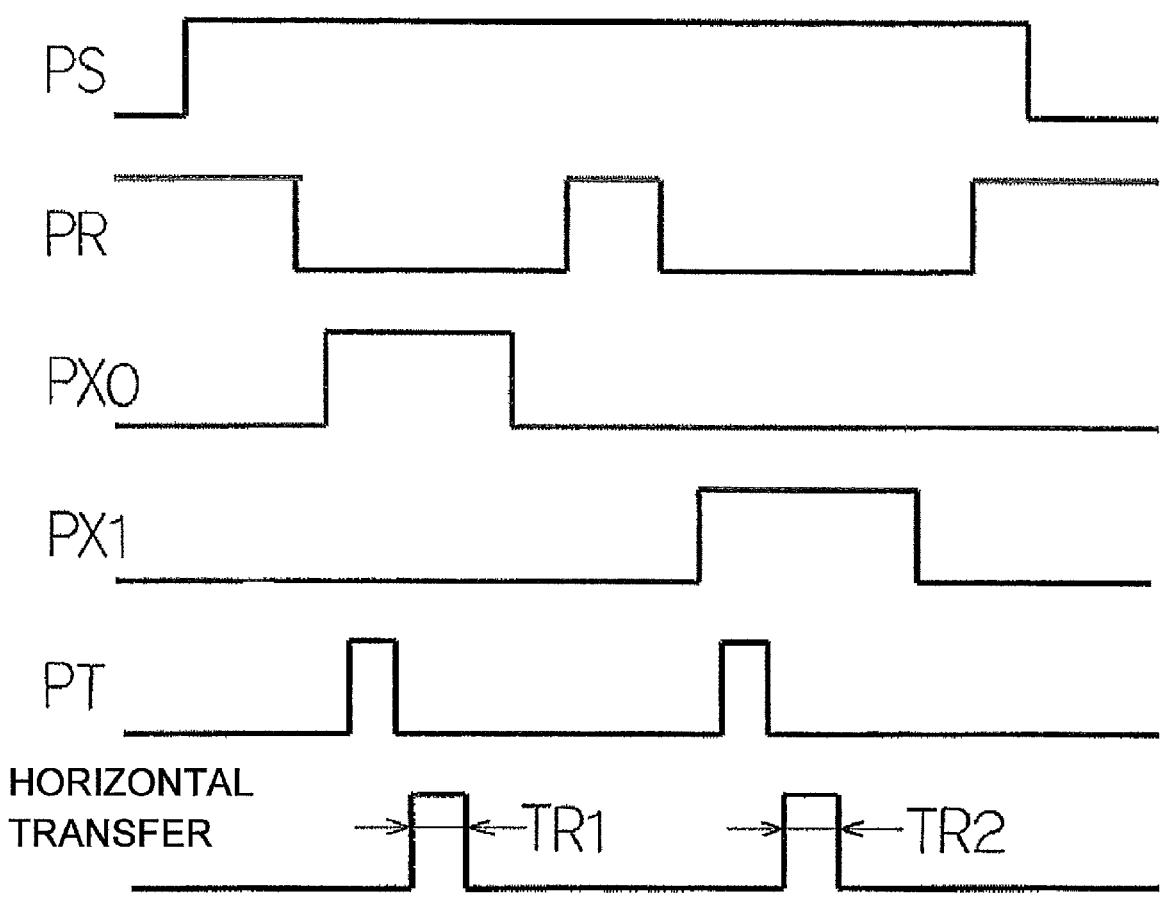
FIG. 10 is a timing chart showing operations of units provided in the image sensor according to the embodiment.

FIG. 10 is a timing chart showing operations of units provided in the image sensor according to the embodiment. First, a control pulse PS is switched to a high level in response to a timing output from the vertical scanning circuit 79, so that the horizontal selection switch MOS transistor 66 is turned ON and pixels in this horizontal line are selected. Next, a control pulse PR is switched to a low level, so that the resetting of the FD units 57 and 58 of the first and second photoelectric conversion sections are stopped, and the FD units 57 and 58 are brought into a floating state. Then, a control pulse PX0 is switched to the high level, so that the transfer switch MOS transistors 51 and 61 are turned ON, and the charges which are photoelectrically converted at the divided regions 11 and 13 are transferred to the FD units 57 and 58. At this time, a control pulse PX1 is at the low level, and thus, the charges which are photoelectrically converted at the divided regions 12 and 14 are not transferred to the FD units 57 and 58.

Since the charges which are photoelectrically converted at the divided regions 11 and 13 are transferred to the FD units 57 and 58, the electric potentials of the FD units 57 and 58 vary in accordance with the light-receiving amount. At this time, since the source follower amplifier MOS transistors 65 and 68 are in the floating state, by temporarily switching the control pulse PT to the high level, the charges of the FD units 57 and 58 are output to the output accumulation capacitors 74 and 75. The charges accumulated in the output accumulation capacitors 74 and 75 are output from the differential output amplifier 78 during a horizontal transfer period TR1 in response to a scanning timing signal sent from the horizontal scanning circuit 80 to the horizontal transfer MOS transistors 76 and 77.

Next, the control pulse PX0 is switched to the low level, and then the control pulse PR is switched to the high level, so that the FD units 57 and 58 are reset. Then, the control pulse PR is switched to the low level, so that the resetting of the FD units 57 and 58 is stopped, and the FD units 57 and 58 are brought into the floating state. Further, the control pulse PX1 is switched to the high level, so that the transfer switch MOS transistors 52 and 62 are turned ON, and the charges which are photoelectrically converted at the divided regions 12 and 14 are transferred to the FD units 57 and 58. At this time, since the control pulse PX0 is at the low level, the charges accumulated in the divided regions 11 and 13 are not transferred to the FD units 57 and 58.

Since the charges which are photoelectrically converted at the divided regions 12 and 14 are transferred to the FD units 57 and 58, the electric potentials of the FD units 57 and 58 vary in accordance with the light-receiving amount. At this time, since the source follower amplifier MOS transistors 65 and 68 are in the floating state, by temporarily switching the control pulse PT to the high level, the charges of the FD units 57 and 58 are output to the output accumulation capacitors 74 and 75. The charges accumulated in the output accumulation capacitors 74 and 75 are output from the differential output amplifier 78 during a horizontal transfer period TR2 in response to a scanning timing signal sent from the horizontal scanning circuit 80 to the horizontal transfer MOS transistors 76 and 77.

The vertical scanning circuit switches the control pulse PX1 to the low level, then switches the control pulse PR to the high level, and switches the control pulse PS to the low level, to complete the selection of the pixels in this horizontal line. The output of the image sensor is transmitted to a below-described focus detecting device whereby a focus detecting arithmetic processing is performed for detecting the focus adjustment state of the photographic optical system.

Figure 11:
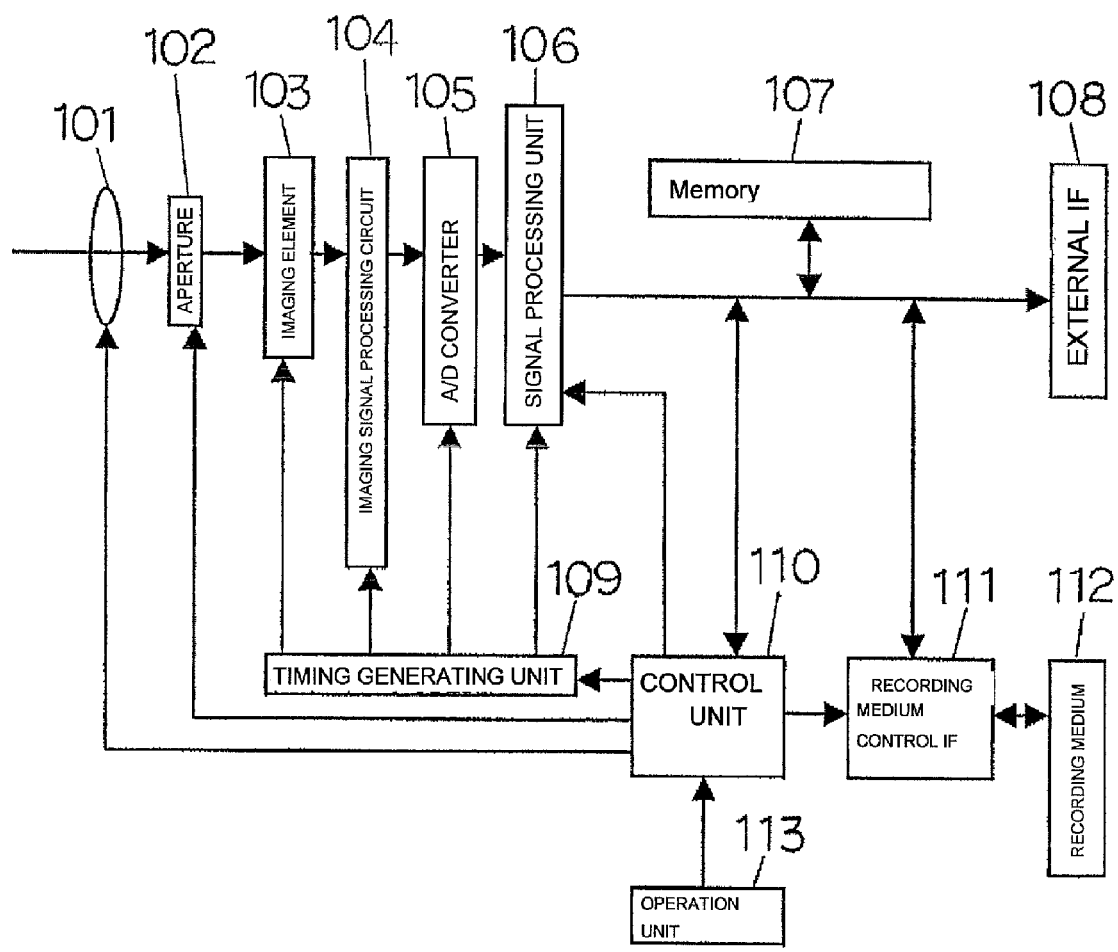
FIG. 11 is an illustration showing a configuration of a focus detecting device and that of an imaging system using the image sensor according to the embodiment.

FIG. 11 is an illustration showing a configuration of a focus detecting device and that of an imaging system using the image sensor according to the embodiment. A photographic optical system 101 focuses an optical image of an object on an image sensor 103. An aperture 102 is an optical aperture which adjusts the amount of light passing through the photographic optical system 101. As described above, the image sensor 103 has the microlens array in which the microlenses 37 are arranged in a two-dimensional plane, and the pixel 20 disposed on the rear side of each microlens 37. The image sensor 103 outputs a focus detecting signal corresponding to an object image formed by the photographic optical system 101.

An imaging signal processing circuit 104 includes a gain variable amplifier which amplifies an output signal of the image sensor 103, a gain correction circuit which corrects again value, and soon. An A/D converter 105 converts an output analogue signal of the image sensor 103 into a digital signal. A signal processing unit 106 provides various corrections for a digital image signal. A timing generating unit 109 outputs various timing signals to the image sensor 103, the imaging signal processing circuit 104, the A/D converter 105, and the signal processing unit 106. A control unit 110 performs various calculations, and controls the entire focus detecting device and the entire imaging system. A memory 107 temporality stores image data.

A recording medium control interface 111 stores image data in a recording medium 112, and reads out image data from the recording medium 112. The recording medium 112 is a removable recording medium like a semiconductor memory for storing image data. An external interface 108 communicates with an external computer or the like. An operation unit 113 is used for operating the focus detecting device and the imaging system.

Referring to FIG. 11, the imaging signal processing circuit 104, the A/D converter 105, the signal processing unit 106, the timing generating unit 109, the control unit 110 and the memory 107 constitute the focus detecting device.

The operation of the focus detecting device and that of the imaging system shown in FIG. 11 are described. When a main power supply and a control power supply are turned ON and then powers of photographic system circuits such as the A/D converter 105 are turned ON, the control unit 110 starts the operation of the focus detecting device and that of the imaging system. First, the aperture 102 is opened for controlling a light exposure, and the A/D converter 105 converts an output signal of the image sensor 103 into digital imaging data. Then, the signal processing unit 106 provides various corrections to the imaging data, and the memory 107 stores the data.

Then, a known correlation calculation is performed by phase detection method using the imaging data stored in the memory 107, so as to detect the focus adjustment state of the photographic optical system 101. Based on the result of the focus detection, it is determined whether or not the photographic optical system 101 is in focus or not. If it is determined that the photographic optical system 101 is not in focus, the focus of the photographic optical system 101 is adjusted in accordance with the result of the focus detection. In contrast, if it is determined that the photographic optical system 101 is in focus, a release operation of the operation unit 113 is confirmed. If the release operation is confirmed, outputs of the divided regions 11 and 12 of the first photoelectric conversion section and outputs of the divided regions 13 and 14 of the second photoelectric conversion section of the image sensor 103 are combined, and the combined output is written into the memory 107 as imaging data. The imaging data stored in the memory 107 is stored in the recording medium 112 through the recording medium control interface 111, or is output to an external computer or the like through the external interface 108.

Figure 12:
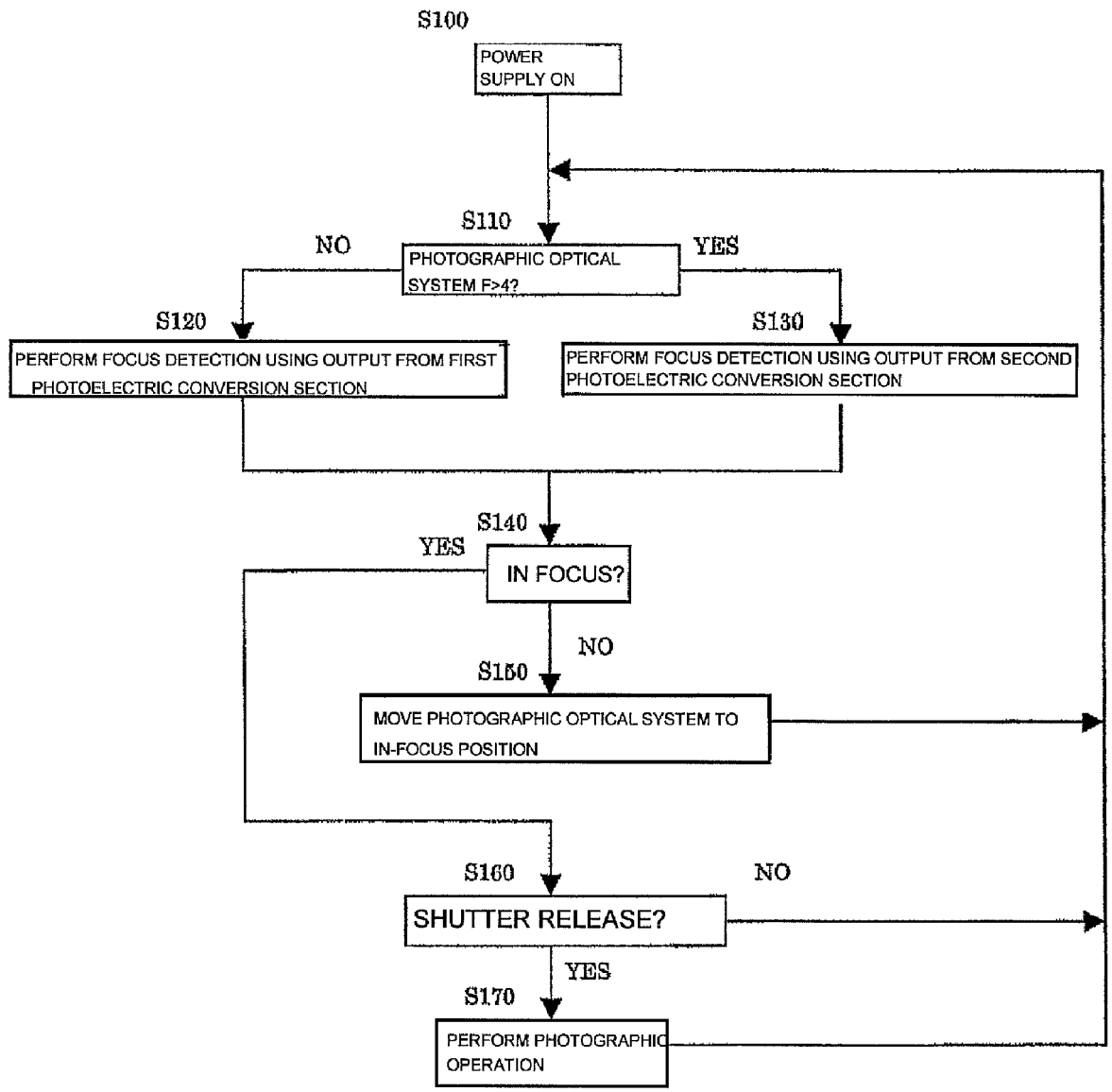
FIG. 12 is a flowchart showing an operation of the focus detecting device and that of the imaging system according to the embodiment.

FIG. 12 is a flowchart showing operation of the focus detecting device and that of the imaging system according to the embodiment. When the power supply is turned ON in step S100, the procedure goes onto step S110 to determine whether or not the f-number at the maximum aperture of the photographic optical system 101 is 4 or greater, that is, whether or not the exit pupil is darker than f/4. When the f-number is greater than 4 and represents a dark condition, the procedure goes onto step S130 to perform the focus detecting calculation based on the outputs of the second photoelectric conversion section (13, 14), and calculate a defocus amount. In contrast, when the f-number is 4 or smaller and represents a bright condition, the procedure goes onto step S120 to perform the focus detecting calculation based on the outputs from the first photoelectric conversion section (11, 12), and calculates a defocus amount.

In step S140, it is determined whether the photographic optical system 101 is in focus or not based on the defocus amount obtained by the focus detecting calculation. When the photographic optical system 101 is not in focus, the procedure goes onto step S150 to drive the photographic optical system 101 to an in-focus position, and then the procedure goes back to step S110 to repeat the focus detection. In contrast, when the photographic optical system 101 is in focus, the procedure goes onto step S160, and it is determined whether or not shutter release is carried out. In a case where the shutter release is not carried out, the procedure goes back to step S110 to repeat the focus detection. In a case where the shutter release is carried out, the procedure goes onto step S170 to perform an imaging operation, and then the procedure goes back to step S110 to repeat the focus detection.

Figure 13:
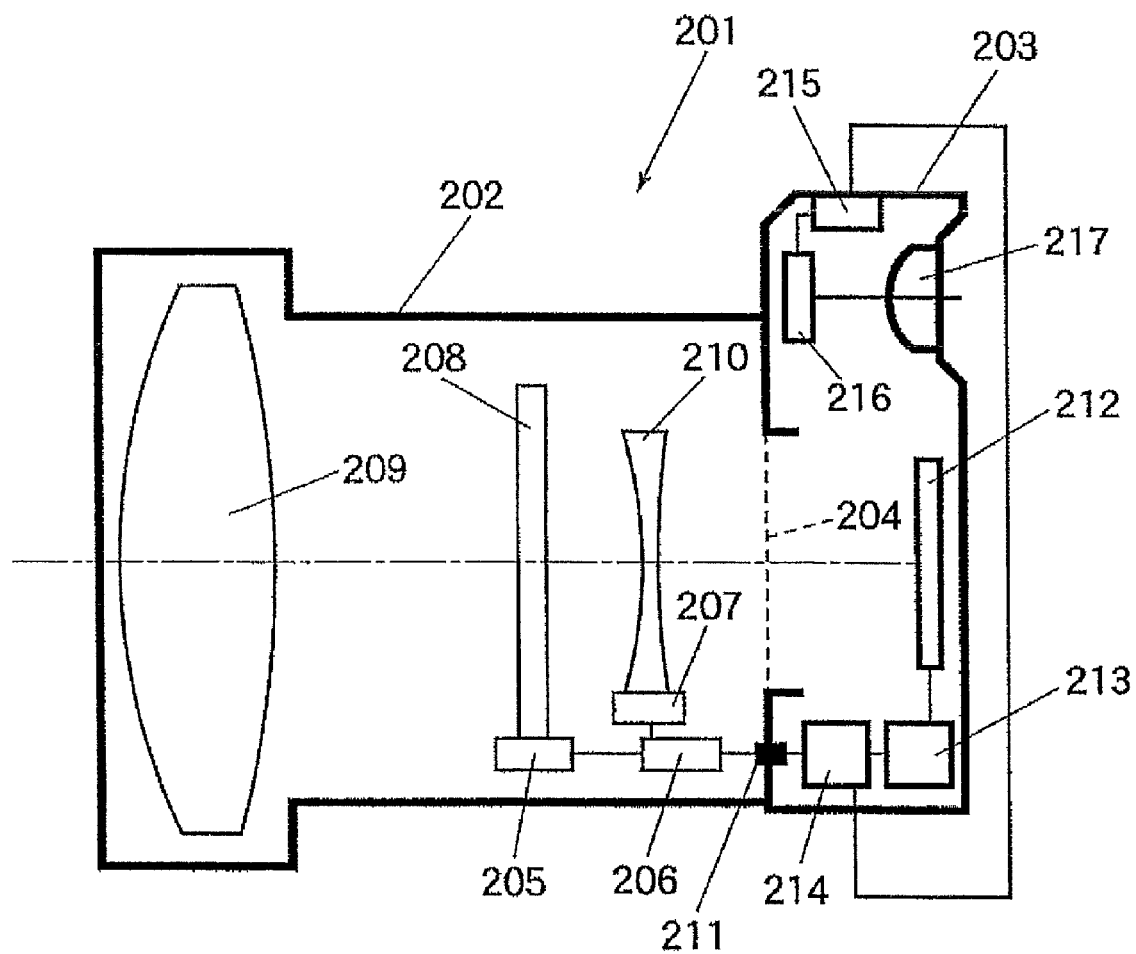
FIG. 13 is an illustration showing a configuration of an imaging system according to an embodiment.

FIG. 13 is an illustration showing a configuration of an imaging system (digital still camera) according to an embodiment. In a digital still camera 201 according to an embodiment, an interchangeable lens 202 is mounted to a camera body 203 using a lens mount 204. The interchangeable lens 202 includes lenses 209 and 210, an aperture 208, an aperture driving device 205, a lens driving device 207 for driving the focusing lens 210, a lens CPU 206 for controlling the aperture driving device 205 and the lens driving device 207, and the like.

The camera body 203 includes an image sensor 212, a focus detecting device 213, a body CPU 214, a liquid crystal display element 216 of an electric view finder, an eyepiece 217 for viewing the liquid crystal display element 216, a liquid crystal display element driving circuit 215, and the like. The image sensor 212 is disposed at an predetermined imaging plane of the interchangeable lens 202. The focus detecting device 213 detects the focus adjustment state of the interchangeable lens 202 based on the output of the image sensor 212. The body CPU 214 controls the operation of the entire digital still camera. The liquid crystal display element driving circuit 215 drives the liquid crystal display element 216 of the electric view finder based on the control of the body CPU 214. The body CPU 214 transmits and receives various information components to and from the lens CPU 206 via an electric contact 211 disposed on the lens mount 204, the various information components including lens characteristic information such as the f-number of maximum aperture, focus adjustment information used for driving the lens, and aperture control information used for controlling the aperture.

An object image passing through the interchangeable lens 202 and formed on the image sensor 212 is photoelectrically converted by the plurality of divided regions 11 to 14 of the first photoelectric conversion section (11, 12) and the second photoelectric conversion section (13, 14) shown in FIG. 1, and the outputs are transmitted to the focus detecting device 213 and the body CPU 214. The focus detecting device 213 performs the focus detecting calculation based on the output of the image sensor 212 to calculate the defocus amount which represents the focus adjustment state of the interchangeable lens 202, and transmits the calculated result to the body CPU 214.

The body CPU 214 determines whether the state is in focus or not in focus based on the defocus amount. If the state is determined to not in focus, the body CPU 214 transmits the lens driving information corresponding to the defocus amount to the lens CPU 206. The lens CPU 206 controls the lens driving device 207 based on the lens driving information, to move the focusing lens 210 to the in-focus position. The body CPU 214 generates an image signal based on the output signal of the image sensor 212, to display an image using the liquid crystal display element driving circuit 215.

[Modification of Image Sensor]

Figure 14:
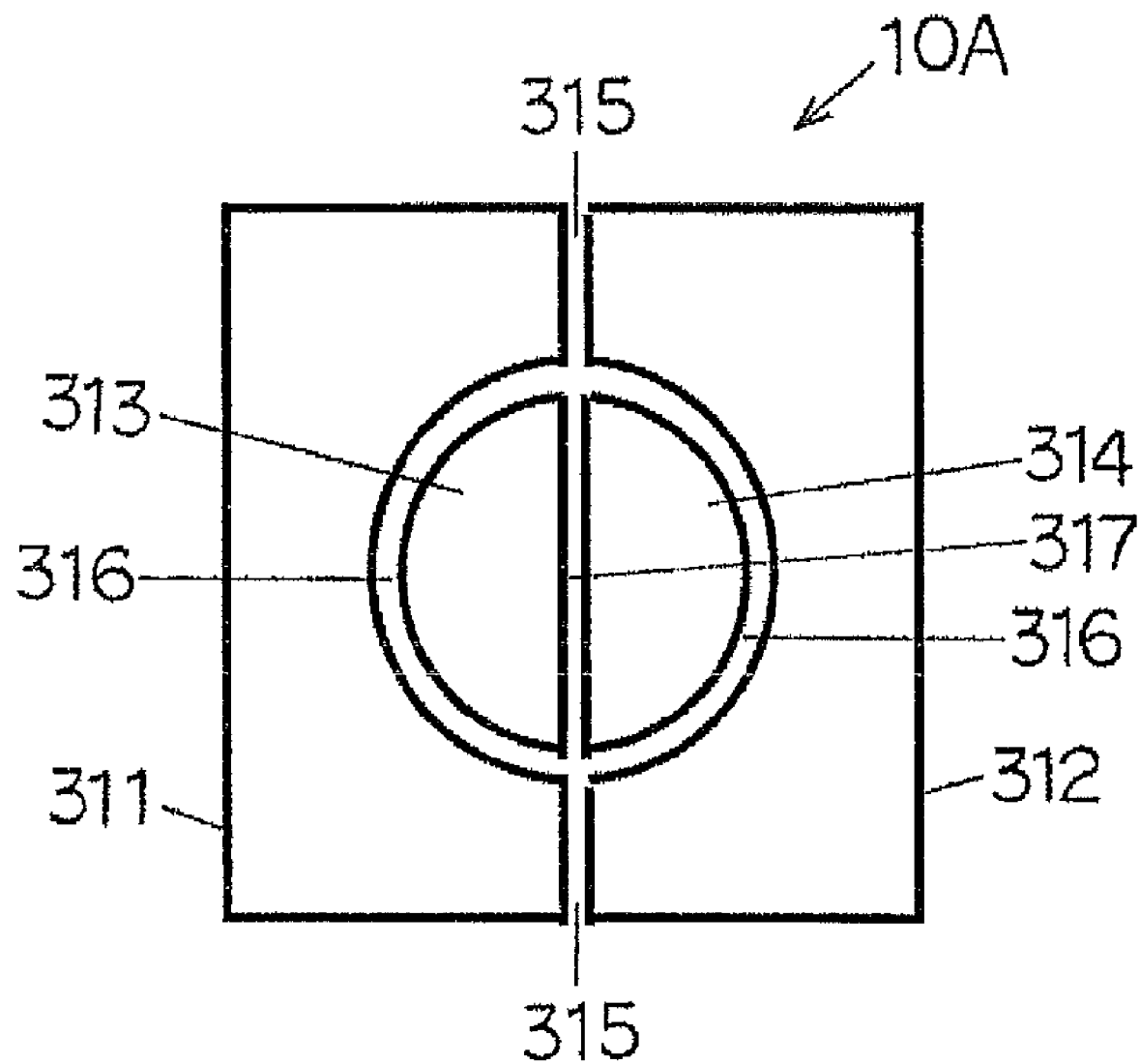
FIG. 14 is an illustration showing an arrangement of photoelectric conversion sections of an image sensor according to a modification.

FIG. 14 is an illustration showing an arrangement of photoelectric conversion sections of an image sensor according to a modification. A photoelectric conversion element 10A has two pairs of photoelectric conversion sections, i.e., a first photoelectric conversion section (311, 312) and a second photoelectric conversion section (313, 314). The area of the second photoelectric conversion section (313, 314) is smaller than the area of the first photoelectric conversion section (311, 312). The outer periphery of the second photoelectric conversion section (313, 314) is surrounded with the first photoelectric conversion section (311, 312).

The profile of the first photoelectric conversion section (311, 312) is rectangular, and the profile of the second photoelectric conversion section (313, 314) is circular. The first photoelectric conversion section (311, 312) is divided into a pair of photoelectric conversion regions 311 and 312 by separators 315 and 316, and the second photoelectric conversion section (313, 314) is divided into a pair of photoelectric conversion regions 313 and 314 by a separator 317. The extending direction of the separator 315 is aligned with the separator 317. Accordingly, the array direction of the divided regions 311 and 312 of the first photoelectric conversion section is aligned with the divided regions 313 and 314 of the second photoelectric conversion section.

In the image sensor of the modification shown in FIG. 14, since the profile of the first photoelectric conversion section (311, 312) is rectangular, wiring lines for controlling and outputting can be arranged straight such that each of pixels is surrounded with the wiring lines when the pixels are two-dimensionally arrayed vertically and horizontally. Also, the light-receiving area of the pixel, i.e., the light-receiving area of the photoelectric conversion element 10A can be maximized while realizing an efficient positional relationship with respect to the wiring lines. Also, in the image sensor of the modification, the second photoelectric conversion section (313, 314) is provided at the inner side of the first photoelectric conversion section (311, 312), and the profile of the second photoelectric conversion section (313, 314) is circular. Accordingly, vignetting of the focus-detecting light beams does not occur even when the focus detection of the photographic optical system with a large f-number is attempted to be performed, and also, the focus-detecting light beams passing through the exit pupil can be effectively used.

[Another Modification of Image Sensor]

Figure 15:
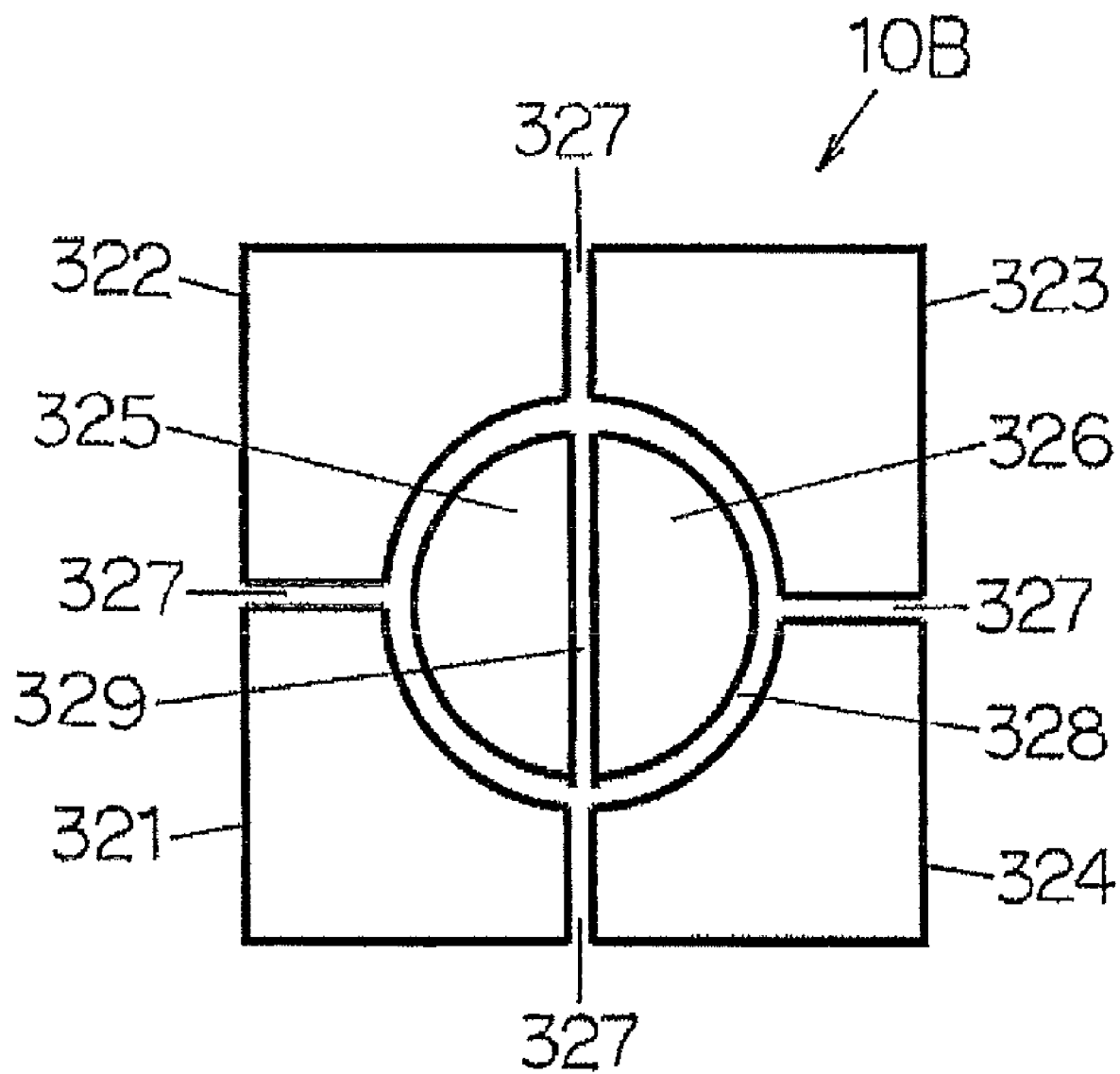
FIG. 15 is an illustration showing an arrangement of photoelectric conversion sections of an image sensor according to another modification.

FIG. 15 is an illustration showing an arrangement of photoelectric conversion sections of an image sensor according to another modification. A photoelectric conversion element 10B has two pairs of photoelectric conversion sections, i.e., a first photoelectric conversion section (321 to 324) and a second photoelectric conversion section (325, 326). The area of the second photoelectric conversion section (325, 326) is smaller than the area of the first photoelectric conversion section (321 to 324). The outer periphery of the second photoelectric conversion section (325, 326) is surrounded with the first photoelectric conversion section (321 to 324).

The profile of the first photoelectric conversion section (321 to 324) is rectangular, and the profile of the second photoelectric conversion section (325, 326) is circular. The first photoelectric conversion section (321 to 324) is divided into four photoelectric conversion regions 321, 322, 323, and 324 by separators 327 and 328, and the second photoelectric conversion section (325, 326) is divided into a pair of photoelectric conversion regions 325 and 326 by a separator 329.

The separator 327 for dividing the first photoelectric conversion section (321 to 324) has the cross shape extending vertically and horizontally. The vertical direction of the separator 327 is aligned with the direction of the separator 329 of the second photoelectric conversion section (325, 326). Accordingly, the divided regions 321 and 324, the divided regions 322 and 323 of the first photoelectric conversion section (321 to 324), and the divided regions 325 and 326 of the second photoelectric conversion section are respectively arrayed in a horizontal direction (in a horizontal direction of the imaging screen). Also, the divided regions 321 and 322, and the divided regions 323 and 324 of the first photoelectric conversion section (321 to 324) are respectively arrayed in a vertical direction (in a vertical direction of the imaging screen). Further, the divided regions 321 and 323, and the divided regions 322 and 324 of the first photoelectric conversion section (321 to 324) are respectively arrayed in a diagonal direction.

In the image sensor of the another modification shown in FIG. 15, since the profile of the first photoelectric conversion section (321 to 324) is rectangular, wiring lines for controlling and outputting can be arranged straight such that each of pixels is surrounded with the wiring lines when the pixels are two-dimensionally arrayed vertically and horizontally. Also, the light-receiving area of the pixel, i.e., the light-receiving area of the photoelectric conversion element 10B can be maximized while realizing an efficient positional relationship with respect to the wiring lines. Also, in the image sensor of the modification, the second photoelectric conversion section (325, 326) is provided at the inner side of the first photoelectric conversion section (321 to 324), and the profile of the second photoelectric conversion section (325, 326) is circular. Accordingly, vignetting of the focus-detecting light beams does not occur even when the focus detection of the photographic optical system with a large f-number is attempted to be performed, and also, the focus-detecting light beams passing through the exit pupil can be effectively used.

Further, in the image sensor of the another modification shown in FIG. 15, the first photoelectric conversion section (321 to 324) is divided into four regions by the separator 327 having a cross shape extending vertically and horizontally. Owing to this, the focus detection can be performed in the vertical direction of the imaging screen using the divided regions 321 and 322, and the divided regions 323 and 324, and in the horizontal direction of the imaging screen using the divided regions 321 and 324, and the divided regions 322 and 323, as well as in a diagonally right-up direction using the divided regions 321 and 323, and in a diagonally right-down direction using the divided regions 322 and 324.

[Still Another Modification of Image Sensor]

Figure 16:
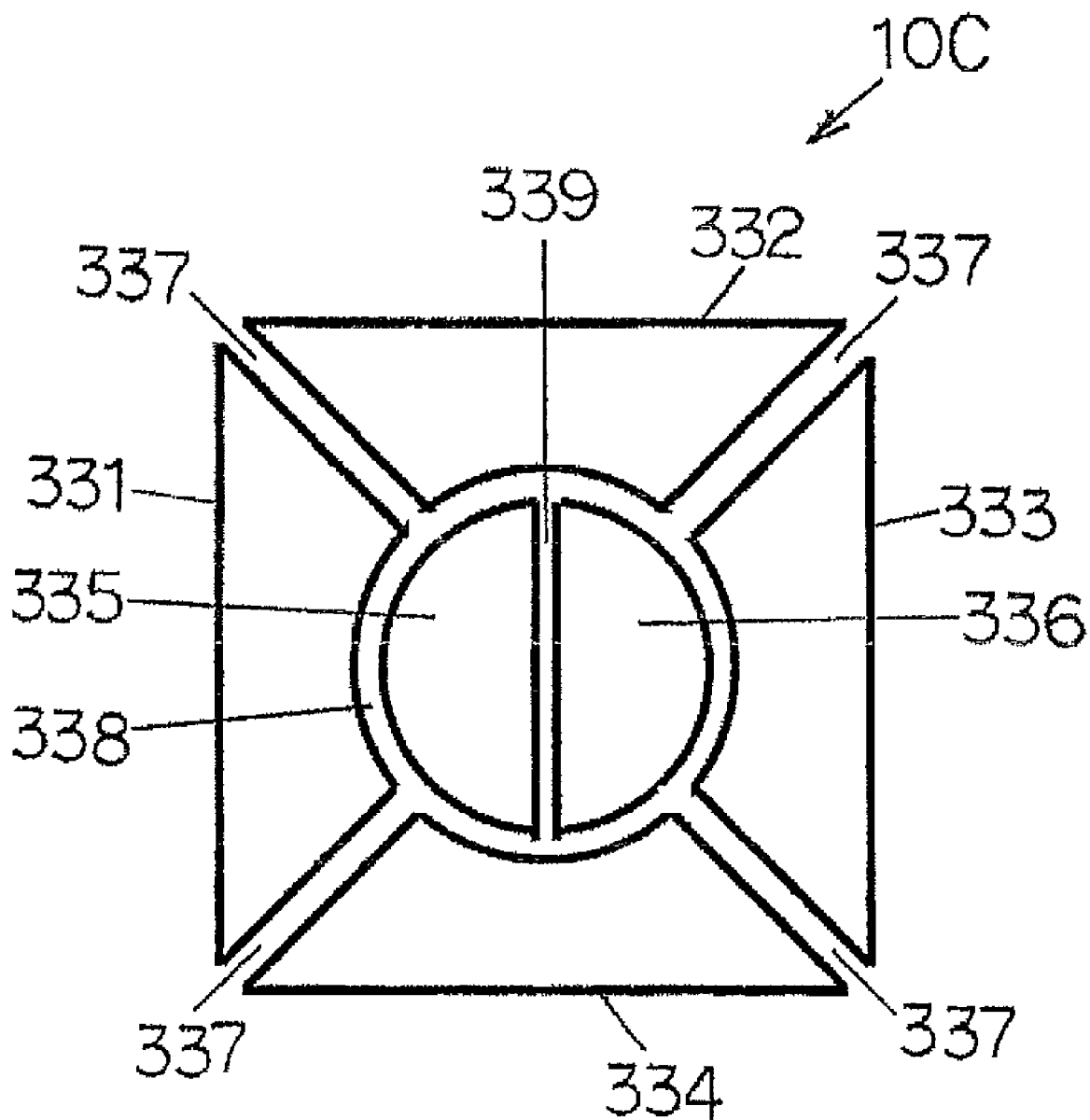
FIG. 16 is an illustration showing an arrangement of photoelectric conversion sections of an image sensor according to still another modification.

FIG. 16 is an illustration showing an arrangement of photoelectric conversion sections of an image sensor according to still another modification. A photoelectric conversion element 10 has two pairs of photoelectric conversion sections, i.e., a first photoelectric conversion section (331 to 334) and a second photoelectric conversion section (335, 336). The area of the second photoelectric conversion section (335, 336) is smaller than the area of the first photoelectric conversion section (331 to 334). The outer periphery of the second photoelectric conversion section (335, 336) is surrounded with the first photoelectric conversion section (331 to 334).

The profile of the first photoelectric conversion section (331 to 334) is rectangular, and the profile of the second photoelectric conversion section (335, 336) is circular. The first photoelectric conversion section (331 to 334) is divided into four photoelectric conversion regions 331, 332, 333, and 334 by a separator 337, and the second photoelectric conversion section (335, 336) is divided into a pair of photoelectric conversion regions 335 and 336 by a separator 339.

The separator 337 for dividing the first photoelectric conversion section (331 to 334) has an X shape. The separator 339 for dividing the second photoelectric conversion section (335, 336) extends in the vertical direction Accordingly, the divided regions 331 and 333 of the first photoelectric conversion section (331 to 334), and the divided regions 335 and 336 of the second photoelectric conversion section are respectively arrayed in the horizontal direction (in the horizontal direction of the imaging screen). Also, the divided regions 332 and 334 of the first photoelectric conversion section (331 to 334) are arrayed in the vertical direction (in the vertical direction of the imaging screen).

In the image sensor of the still another modification shown in FIG. 16, since the profile of the first photoelectric conversion section (331 to 334) is rectangular, wiring lines for controlling and outputting can be arranged straight such that each of pixels is surrounded with the wiring lines when the pixels are two-dimensionally arrayed vertically and horizontally. Also, the light-receiving area of the pixel, i.e., the light-receiving area of the photoelectric conversion element 10C can be maximized while realizing an efficient positional relationship with respect to the wiring lines. In addition, in the image sensor of the modification, since the second photoelectric conversion section (335, 336) is disposed at the inner side of the first photoelectric conversion section (331 to 334), and the profile of the second photoelectric conversion section (335, 336) is circular, vignetting of the focus-detecting light beams does not occur even when the focus detection of the photographic optical system with a large f-number is attempted to be performed, and also, the focus-detecting light beams passing through the exit pupil can be effectively used.

Further, in the image sensor of the still another modification shown in FIG. 16, the first photoelectric conversion section (331 to 334) is divided into four regions by the separator 337 having the X shape. Accordingly, the focus detection can be performed in the horizontal direction of the imaging screen using the divided regions 331 and 333, and in the vertical direction of the imaging screen using the divided regions 332 and 334, as well as in a diagonally right-up direction using the divided regions 331 and 332, and the divided regions 333 and 334, and in a diagonally right-down direction using the divided regions 331 and 334, and the divided regions 332 and 333.

Alternatively, in the image sensor of the still another modification shown in FIG. 16, the area of each of the divided regions 331 to 334 of the first photoelectric conversion section may be substantially equivalent to the area of each of the divided regions 335 and 336 of the second photoelectric conversion section. Accordingly, the output level of each divided region can be uniform even though a charge accumulation period of each divided region is controlled to become uniform. Thus, even when the focus-detecting position is located at the peripheral portion of the screen, which may cause the exit pupil to be deformed and the center of the exit pupil to be displaced as viewed from the focus-detecting position, the focus detecting calculation is performed, for example, by using the divided region 331 of the first photoelectric conversion section and the divided region 335 of the second photoelectric conversion section, or using the divided region 333 of the first photoelectric conversion section and the divided region 336 of the second photoelectric conversion section, thereby performing the focus detection in the horizontal direction of the imaging screen.

[Yet Another Modification of Image Sensor]

Figure 17:
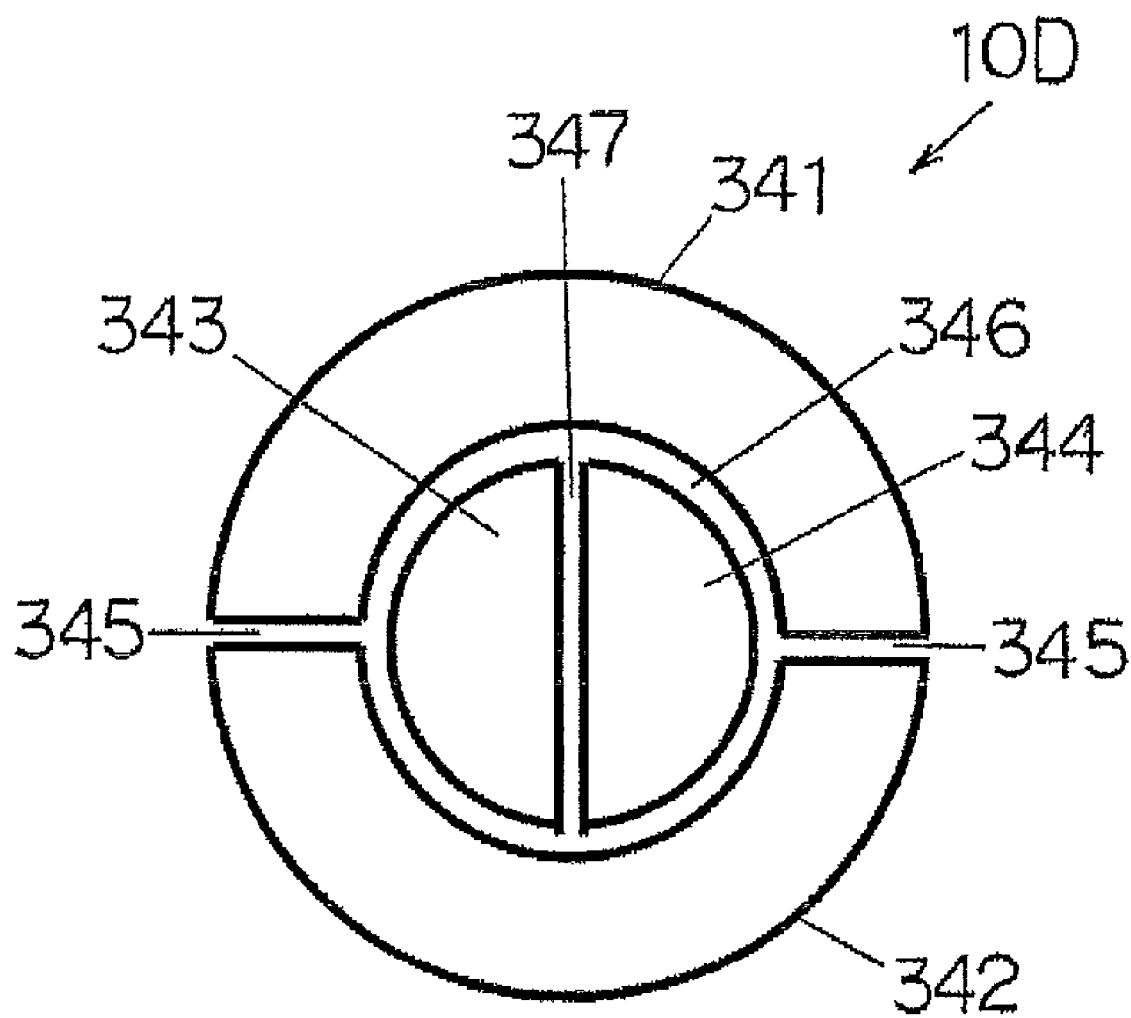
FIG. 17 is an illustration showing an arrangement of photoelectric conversion sections of an image sensor according to yet another modification.

FIG. 17 is an illustration showing an arrangement of photoelectric conversion sections of an image sensor according to yet another modification. A photoelectric conversion element 10D has two pairs of photoelectric conversion sections, i.e., a first photoelectric conversion section (341, 342) and a second photoelectric conversion section (343, 344). The area of the second photoelectric conversion section (343, 344) is smaller than the area of the first photoelectric conversion section (341, 342). The second photoelectric conversion section (343, 344) is surrounded with the first photoelectric conversion section (341, 342).

The profile of the first photoelectric conversion section (341, 342) and the profile of the second photoelectric conversion section (343, 344) are both circular. The first photoelectric conversion section (341, 342) is divided into a pair of photoelectric conversion regions 341 and 342 by separators 345 and 346, and the second photoelectric conversion section (343, 344) is divided into a pair of photoelectric conversion regions 343 and 344 by a separator 347. The separator 345 of the first photoelectric conversion section (341, 342) is orthogonal to the separator 347 of the second photoelectric conversion section (343, 344), and thus, the array direction of the divided regions 341 and 342 of the first photoelectric conversion section is orthogonal to the array direction of the divided regions 343 and 344 of the second photoelectric conversion section.

In the image sensor of the yet another modification showing in FIG. 17, since the profile of the first photoelectric conversion section (341, 342) and the profile of the second photoelectric conversion section (343, 344) are both circular, vignetting of the focus-detecting light beams does not occur even when the focus detection of the photographic optical system with a large f-number is attempted to be performed, and also, the focus-detecting light beams passing through the exit pupil can be effectively used.

Further, in the image sensor of the yet another modification shown in FIG. 17, since the photoelectric conversion sections are divided such that the array direction of the divided regions 341 and 342 of the first photoelectric conversion section is orthogonal to the array direction of the divided regions 343 and 344 of the second photoelectric conversion section, the focus detection of the photographic optical system can be performed in the vertical and horizontal directions of the imaging screen.

[Modification of Image Sensor Circuit]

Figure 18:
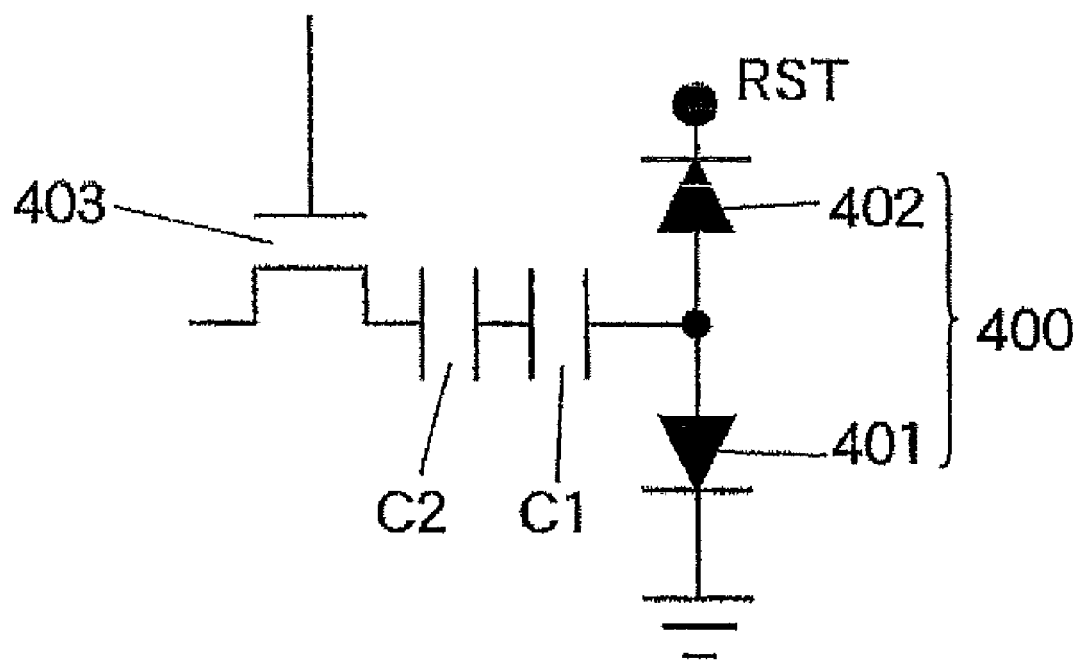
FIG. 18 is an illustration showing a modification of an image sensor circuit.

FIG. 18 is an illustration showing a modification of an image sensor circuit. The basic circuit structure is similar to that shown in FIG. 9, and thus, the difference is mainly described. A divided region 400 of a photoelectric conversion section is composed of photodiodes 401 and 402 whose anodes are commonly connected. A cathode of one photodiode 401 is connected to the ground, and a cathode of the other photodiode 402 is connected to a reset terminal RST. Accordingly, in this modification, when a reset pulse is input from the reset terminal RST, the photodiodes 401 and 402 can be reset directly.

Also, in the divided region 400 of the photoelectric conversion section according to the modification, the node of the anodes of the photodiodes 401 and 402 is connected to a source of a MOS transistor 403 through capacitors C1 and C2. When the MOS transistor 403 is turned ON, an electric potential of the divided region 400 of the photoelectric conversion section is applied to a gate of a transistor (not shown) which is connected to a drain of the MOS transistor 403, the transistor amplifies the electric potential, and the amplified output is transmitted to a vertical signal line.

Figure 19:
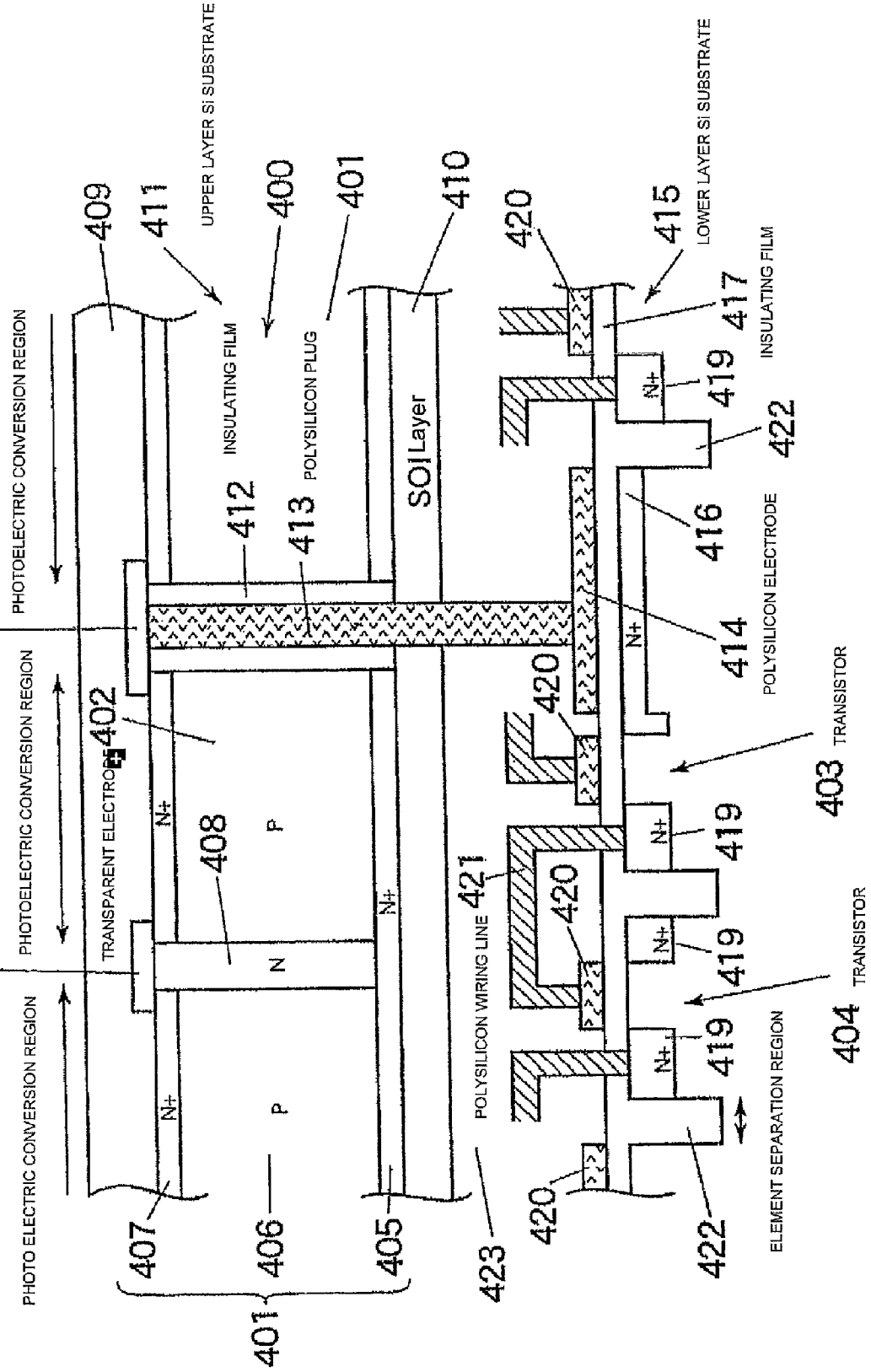
FIG. 19 is a cross-sectional view showing a configuration of the image sensor according to the modification shown in FIG. 18.

FIG. 19 is a cross-sectional view showing a configuration of the image sensor according to the modification shown in FIG. 18. The image sensor uses a laminated SOI substrate. A SOI insulating layer 410 has the divided region 400 of the photoelectric conversion section formed at the upper side (upper layer Si substrate 411), and elements such as the transistors 403 and 404 for a readout circuit and a driving circuit formed at the lower side.

The photodiodes 401 and 402 are formed at the upper side of the SOI insulating layer 410 by stacking impurity layers of an N+ region 405, a P region 406, and a surface N+ region 407, sequentially from the lower layer. An N-type impurity layer 408 is provided at a boundary region between the photodiodes 401 and 402, so as to electrically insulate the adjacent elements. The surfaces of the photodiodes 401 and 402 are connected to a transparent electrode 409 provided in one layer, through the surface N+ region 407.

A polycrystal silicon vertical wiring line (polysilicon plug) 413 is disposed at a boundary portion between the pair of photodiodes 401 and 402, with an insulating film 412 interposed. The polycrystal silicon vertical wiring line 413 serves as a capacitor (capacitor C1). The polycrystal silicon vertical wiring line 413 is formed to vertically penetrate through the SOI insulating film 410, and the bottom thereof disposed at the lower side of the SOI insulating film 410 is connected to a lower layer polycrystal silicon electrode 414. The lower layer polycrystal silicon electrode 414 and an N+ layer 416 are provided at a lower layer Si substrate 415 with an insulating film 417 interposed therebetween, and the lower layer polycrystal silicon electrode 414 and the N+ layer 416 serve as a capacitor (capacitor C2). The upper end of the polycrystal silicon vertical wiring line 413 is insulated from the transparent electrode 409 by way of an insulating film 418.

At the lower layer Si substrate 415, N+ layers 416 and 419 serving as sources and drains of the transistors 403 and 404 are provided at the lower side of the insulating film 417. Among the N+ layers 416 and 419, the N+ layer 416 which serves as the source of the transistor 403 is disposed to correspond to the above-mentioned lower layer polycrystal silicon electrode 414. At the upper side of the insulating film 417, in addition to the above-mentioned lower layer polycrystal silicon electrode 414, a lower layer polycrystal silicon gate electrode 420 is provided which corresponds to each of gates of the transistors 403 and 404. Wiring lines of the transistors 403 and 404 are formed by polysilicon wiring lines 421 provided in one layer. Thus, the circuit configuration shown in FIG. 18 is provided.

A part of the insulating film 417 extends to a lower layer and serves as an element dividing region 422. An oxide film 423 is laminated on the upper layer of the insulating film 417 by CVD or the like, so that the lower layer polycrystal silicon electrodes 414 and 420, the polysilicon wiring lines 421, and the like, are covered with the oxide film 423 in an insulating manner. Though not shown, output circuits such as a vertical scanning circuit, and wiring lines are formed at the lower side of the SOI insulating layer 410.

As described above, with the structure in which the photoelectric conversion section and the charge readout unit (output circuit) are laminated in the light incident direction, the structure and the wiring lines for reading out charges are embedded in the element and not exposed at the surface of the image sensor. Accordingly, the degree of freedom for the shape and arrangement of the divided region of the photoelectric conversion section can be enhanced, thereby improving the numerical aperture.

The operation of the above-described image sensor is described. Light incident on the photodiodes 401 and 402 causes charges to be generated at the photodiodes 401 and 402, and the charges are accumulated in the P region 406. At this time, by appropriately changing the electric potential of the transparent electrode 409 connected to the surfaces of the photodiodes 401 and 402, a maximum accumulation amount is determined, and a noise component generated at the interface between the surface N+ layer 407 at Si and the transparent electrode 409 due to the interface level, is discharged to the transparent electrode 409.

Also, by applying an electric potential lower than that of the P region 406 to the transparent electrode 409, all charges accumulated in the photoelectric conversion regions of the photodiodes 401 and 402 are discharged to the transparent electrode 409, thereby resetting the photodiodes 401 and 402. At this time, when a voltage is applied to all photodiodes, the operation may work as an electronic shutter.

When exposure is applied for a predetermined period while the electric potential of the transparent electrode 409 is kept, the charge generated by the photoelectric conversion changes the electric potentials of the photodiodes 401 and 402, that is, changes the electric potential of the polysilicon plug 413, and hence this electric potential changes the electric potential of the source portion (N+ layer 416) of the readout transistor 403. The changed electric potential is transmitted to the gate of the transistor 404, and is output via a source follower circuit. With this configuration, since the photodiodes 401 and 042 are insulated from the wiring lines (polysilicon plug 413) for transmitting the electric potential by using a reliable insulating film (thermally-oxidized film), a noise source mainly due to the interface level is reduced. That is, the noise amount is relatively small with respect to the signal charge.

The present invention is not limited to the above-described embodiment. Other embodiments made within the scope of the technical idea of the present invention are included in the present invention. For example, the structure of the photoelectric conversion section is not limited to those shown in FIGS. 18 and 19. Other structures may be employed, as long as a three-dimensional circuit structure is provided in which the photoelectric conversion section is provided on the surface of the image sensor and the output circuit is provided at the lower side of the photoelectric conversion section. Also, regarding the output type of the charge, the image sensor is not limited to the MOS-type image sensor shown in FIG. 9, and may be a charge-transfer type (CCD-type) image sensor.

Further, the profile of the photoelectric conversion sections (pixel), the profile of the divided region, the array direction, and the number of divided regions are not limited to those of the image sensor according to the embodiment shown in FIG. 1 or the image sensors according to the modifications shown in FIGS. 14 to 17. To provide as many pixels as possible per unit area, the profile of the first photoelectric conversion section may be a polygon, such as an approximately rectangular shape, a regular tetragon, a hexagon, or the like. Also, the profile of the second photoelectric conversion section may be an approximately circular shape. The approximately circular shape may include a shape which is not a complete circle, but is close to a circle, a polygonal shape which is close to a circle, and the like. Further, the second photoelectric conversion section may be divided into three or more regions. The structure of the photoelectric conversion sections is not limited to a set of two sections including the first and second photoelectric conversion sections, and may be a set of multiple sections, like a set of three or more sections, for example, by dividing using a plurality of concentric separators with different radii. With this structure, the photoelectric conversion section used for the focus detection can be selected precisely corresponding to the deformation of the exit pupil in relation to the size of the exit pupil of the photographic optical system and the focus-detecting position on the imaging screen.

The array manner of the pixels is not limited to the vertical and horizontal array shown in FIG. 2. For example, pixels located on every other line or every other row may be turned by 90 degrees, or pixels located in a staggered manner may be turned by 90 degrees. Alternatively, pixels located at a predetermined block may be turned by 90 degrees. Still alternatively, both of general imaging pixels and the pixels in the present invention may be used.

The subject application has its basis on the following document, which is hereby incorporated by reference herein.

Japanese Patent Application No. 2005-212908 (filed Jul. 22, 2005)

The invention claimed is:

1. An autofocus system comprising:
an image sensor which includes two-dimensionally arrayed pixels and micro-optical systems arrayed so as to correspond to the pixels;
a photographic optical system through which light of an object passes and which focuses an object image on the image sensor;
a focus detecting device which performs correlation calculation by phase detection method to detect a focus adjustment state of the photographic optical system; and
a focus adjusting device which adjusts the focus of the -photographic optical system based on a detection result of the focus detecting device, wherein
each of the pixels of the image sensor has a first photoelectric conversion section which is divided into a plurality of regions to perform photoelectric conversion, and a second photoelectric conversion section whose outer periphery is surrounded with the plurality of regions of the first photoelectric conversion section and which is divided into a plurality of regions to perform photoelectric conversion;
the micro-optical systems of the image sensor guides the light of the object to the pixels;
a size of the second photoelectric conversion section is configured such that the second photoelectric conversion section is entirely in the light of the object guided thereto by the micro-optical systems, when an f-number of the photographic optical system satisfies a predetermined condition;
the focus detecting device performs the correlation calculation based on at least one of outputs from the plurality of regions of the first photoelectric conversion section and outputs from the plurality of regions of the second photoelectric conversion section; and
the focus detecting device selects either the outputs from the plurality of regions of the first photoelectric conversion section or the outputs from the plurality of regions of the second photoelectric conversion section based on the f-number of the photographic optical system, and performs the correlation calculation based on the selected outputs.

2. The autofocus system according to claim 1, wherein
the focus detecting device selects the outputs from the plurality of regions of the first photoelectric conversion section if the f-number of the photographic optical system is equal to or smaller than 4, and selects the outputs from the plurality of regions of the second photoelectric conversion section if the f-number of the photographic optical system is greater than 4.

3. The autofocus system according to claim 1, wherein
an array direction of the plurality of regions of the first photoelectric conversion section is different from an array direction of the plurality of regions of the second photoelectric conversion section.

4. The autofocus system according to claim 1, wherein:
the number of divided regions of the first photoelectric conversion section is larger than the number of divided regions of the second photoelectric conversion section; and
the plurality of regions of the first photoelectric conversion section and the plurality of regions of the second photoelectric conversion section are respectively arrayed in a imaging screen.

5. The autofocus system according to claim 1, wherein
a direction of at least one of division lines for dividing the plurality of regions of the first photoelectric conversion section is different from a direction of a division line for dividing the plurality of regions of the second photoelectric conversion section.

* * * * *